(12) United States Patent
Takahashi et al.

(10) Patent No.: US 11,308,975 B2
(45) Date of Patent: Apr. 19, 2022

(54) MIXING DEVICE, MIXING METHOD, AND NON-TRANSITORY COMPUTER-READABLE RECORDING MEDIUM

(71) Applicants: The University of Electro-Communications, Tokyo (JP); Hibino Corporation, Tokyo (JP)

(72) Inventors: Kota Takahashi, Tokyo (JP); Tsukasa Miyamoto, Tokyo (JP); Yoshiyuki Ono, Tokyo (JP); Yoji Abe, Kanagawa (JP); Hiroshi Inoue, Tokyo (JP)

(73) Assignees: The University of Electro-Communications, Tokyo (JP); Hibino Corporation, Tokyo (JP)

( * ) Notice: Subject to any disclaimer, the term of this patent is extended or adjusted under 35 U.S.C. 154(b) by 0 days.

(21) Appl. No.: 17/047,504

(22) PCT Filed: Apr. 11, 2019

(86) PCT No.: PCT/JP2019/015832
§ 371 (c)(1),
(2) Date: Oct. 14, 2020

(87) PCT Pub. No.: WO2019/203124
PCT Pub. Date: Oct. 24, 2019

(65) Prior Publication Data
US 2021/0151067 A1 May 20, 2021

(30) Foreign Application Priority Data

Apr. 17, 2018 (JP) .............................. JP2018-078981

(51) Int. Cl.
*G10L 21/0332* (2013.01)
*G10L 21/0364* (2013.01)
(Continued)

(52) U.S. Cl.
CPC ...... *G10L 21/0332* (2013.01); *G10L 21/0364* (2013.01); *H04R 3/00* (2013.01);
(Continued)

(58) Field of Classification Search
CPC . G10L 21/0332; G10L 21/0364; G10H 7/008; G10H 1/46; H04H 60/04;
(Continued)

(56) References Cited

U.S. PATENT DOCUMENTS 5,228,093 A * 7/1993 Agnello ................. H04H 60/04
381/103
6,587,816 B1 7/2003 Chazan et al.
(Continued)

FOREIGN PATENT DOCUMENTS

EP 2860989 4/2015
JP 2010-081505 4/2010
(Continued)

OTHER PUBLICATIONS

Extended European Search Report dated Aug. 25, 2021 with respect to the corresponding European Patent Application No. 19787843.2.
(Continued)

*Primary Examiner* — Matthew A Eason
*Assistant Examiner* — Kuassi A Ganmavo
(74) *Attorney, Agent, or Firm* — IPUSA, PLLC

(57) ABSTRACT

A mixing device of a first signal and a second signal on a time-frequency plane, includes a control signal generation unit to generate a control signal indicating whether to perform prioritized mixing that includes amplification of the first signal and attenuation of the second signal; and a gain derivation unit to derive a first gain for amplifying the first signal and a second gain for attenuating the second signal based on the control signal. The control signal takes at least a first value and a second value different from the first value,
(Continued)

wherein the first value is not continuous beyond a predetermined bandwidth on a frequency axis. The mixing device applies the prioritized mixing to the first and second signals when the control signal indicates the first value, and applies simple addition to the first and second signals when the control signal indicates the second value.

11 Claims, 17 Drawing Sheets

(51) Int. Cl.
| | | |
|---|---|---|
| H04R 3/00 | (2006.01) | |
| H04R 25/00 | (2006.01) | |
| H04S 1/00 | (2006.01) | |
| G10H 7/00 | (2006.01) | |
| G10H 1/46 | (2006.01) | |
| H04S 7/00 | (2006.01) | |
| H04H 60/04 | (2008.01) | |
| H03G 3/20 | (2006.01) | |

(52) U.S. Cl.
CPC ............ *H04R 25/43* (2013.01); *H04S 1/007* (2013.01); *G10H 1/46* (2013.01); *G10H 7/008* (2013.01); *H03G 3/20* (2013.01); *H04H 60/04* (2013.01); *H04R 2420/01* (2013.01); *H04S 7/00* (2013.01)

(58) Field of Classification Search
CPC ...... H04R 3/00; H04R 25/43; H04R 2420/01; H04S 1/007; H04S 7/00; H03G 3/20
See application file for complete search history.

(56) References Cited

U.S. PATENT DOCUMENTS

| | | | |
|---|---|---|---|
| 9,715,884 B2 | 7/2017 | Kitazawa | |
| 2003/0221542 A1* | 12/2003 | Kenmochi | G10H 7/002 |
| | | | 84/616 |
| 2008/0269930 A1* | 10/2008 | Yamashita | H04R 5/04 |
| | | | 700/94 |
| 2010/0128882 A1* | 5/2010 | Yamabe | H03G 3/3089 |
| | | | 381/71.1 |
| 2011/0317852 A1 | 12/2011 | Kawano | |
| 2012/0130516 A1* | 5/2012 | Reinsch | G11B 27/00 |
| | | | 700/94 |
| 2013/0272542 A1 | 10/2013 | Tracey | |
| 2014/0219478 A1* | 8/2014 | Takahashi | H04R 3/00 |
| | | | 381/119 |
| 2017/0048641 A1 | 2/2017 | Franck | |
| 2018/0035205 A1 | 2/2018 | Vautin et al. | |

FOREIGN PATENT DOCUMENTS

| | | | |
|---|---|---|---|
| JP | 2012-010154 | 1/2012 | |
| JP | 2013-051589 | 3/2013 | |
| JP | 2013-164572 | 8/2013 | |
| JP | 2016-134706 | 7/2016 | |
| WO | WO-2006085265 A2 * | 8/2006 | ........... G11B 27/038 |

OTHER PUBLICATIONS

International Search Report dated May 21, 2019 with respect to PCT/JP2019/015832.
International Search Report dated May 21, 2019 with respect to PCT/JP2019/015837.
International Search Report dated May 28, 2019 with respect to PCT/JP2019/015834.
Sep. 27, 2017, pp. 465-468, ISSN 1880-7658, in particular, pp. 465-466, fig. 3-4, non-official translation (Katsuyama, Shun et al., "Performance enhancement of smart mixer on condition of stereo playback", Lecture proceedings of 2017 autumn meeting the Acoustical Society of Japan CD-ROM, Acoustical Society of Japan).
Florencio D A F Ed—Institute of Electrical and Electronics Engineers: "On the use of asymmetric windows for reducing the time delay in real-time spectral analysis", Speech Processing 1. Toronto, May 14-17, 1991; [International Conference on Acoustics, Speech & Signal Processing. ICASSP], New York, IEEE, US, vol. CONF. 16, Apr. 14, 1991 (Apr. 14, 1991), pp. 3261-3264, XP010043720, DOI: 10.1109/ICASSP.1991.150149 ISBN: 978-0-7803-0003-3 *the whole document*.
Extended European Search Report dated Apr. 29, 2021 with respect to the corresponding European Patent Application No. 19787973.7.
Partial Search Report dated Apr. 29, 2021 with respect to the related European Patent Application No. 19787843.2.
Extended European Search Report dated May 18, 2021 with respect to the related European Patent Application No. 19788613.8.

* cited by examiner

MIXING DEVICE, MIXING METHOD, AND NON-TRANSITORY COMPUTER-READABLE RECORDING MEDIUM

TECHNICAL FIELD

The present invention relates to mixing techniques for input signals.

BACKGROUND ART

The smart mixer is a new method of sound mixing, which raises the clarity of priority sound while maintaining a sense of volume of non-priority sound, by mixing the priority sound and the non-priority sound on a time-frequency plane (see, for example, Patent Document 1). The method determines signal characteristics at each point on the time-frequency plane, and depending on the signal characteristics, applies processing for increasing the clarity to the priority sound. However, in the smart mixing, if the emphasis is placed on clarification of the priority sound to be heard, some side effects may occur with respect to the non-priority sound (perception of lack of sound). Thereupon, methods have been proposed to output more natural mixed sound, by appropriately determining gains to be applied to the priority sound and the non-priority sound (see, for example, Patent Document 2).

FIG. 1 is a diagram illustrating a configuration of a conventional smart mixer. Each of priority sound and non-priority sound is deployed on a time-frequency plane, and a gain $\alpha_1$ for the priority sound and a gain $\alpha_2$ for the non-priority sound are derived from the smoothed power obtained for each sound. The priority sound and the non-priority sound are multiplied by the gain $\alpha_1$ and the gain $\alpha_2$, respectively, added, and then, transformed back to a time domain signal to be output.

Two basic principles are used for deriving the gains, which are "principle of the sum of logarithmic intensities" and "principle of fill-in". The "principle of the sum of logarithmic intensities" is to limit the logarithmic intensity of an output signal within a range not exceeding the sum of the logarithmic intensities of input signals. The "principle of the sum of logarithmic intensities" prevents occurrence of feeling of discomfort in the mixed sound, which would be caused by overemphasis on the priority sound. The "principle of fill-in" is to limit the power reduction of the non-priority sound within a range not exceeding the power increase of the priority sound. The "principle of fill-in" prevents occurrence of feeling of discomfort in the mixed sound, which would be caused by over-suppression of the non-priority sound.

Based on these principles, the gains are determined reasonably to output a more natural mixed sound.

RELATED-ART DOCUMENTS

Patent Documents

[Patent Document 1] Japanese Patent No. 5057535
[Patent Document 2] Japanese Laid-Open Patent Application No. 2016-134706

SUMMARY OF THE INVENTION

Problem to be Solved by the Invention

The method of Patent Document 2 assumes a compact and simple playback device such as a smartphone, and as long as being applied to such a playback device, the method exhibits effects of maintaining the clarity of the priority sound, and of making it difficult to perceive degradation of the non-priority sound (sense of missing). However, in mixers for business use, large playback devices are used in pursuit of high-quality sound, and the playback is often performed with high volume. Degradation of a non-priority sound that is not perceived with a small simple playback device may be perceived as unnatural stimulus.

The problem to be solved by the present invention is to provide mixing techniques that can suppress degradation of non-priority sound and output more natural mixed sound, regardless of the size and quality of a playback device.

Means for Solving the Problem

According to the present invention, degradation of non-priority sound is suppressed by applying a prioritized sound mixing process that includes emphasis on priority sound and suppression of the non-priority sound in a specific important frequency band in the priority sound.

Specifically, in one aspect of the present invention, a mixing device of a first signal and a second signal on a time-frequency plane, includes a control signal generation unit configured to generate a control signal indicating whether to perform prioritized mixing that includes amplification of the first signal and attenuation of the second signal; and a gain derivation unit configured to derive a first gain for amplifying the first signal and a second gain for attenuating the second signal based on the control signal. The control signal takes at least a first value and a second value different from the first value, wherein the first value is not continuous beyond a predetermined bandwidth on a frequency axis, and the mixing device applies the prioritized mixing to the first signal and the second signal in response to the control signal indicating the first value, and applies simple addition to the first signal and the second signal in response to the control signal indicating the second value.

Advantage of the Invention

According to the configuration described above, regardless of the size and quality of a playback device, it is possible to suppress degradation of non-priority sound so as to output more natural mixed sound.

DETAILED DESCRIPTION OF THE PREFERRED EMBODIMENTS

Figure 1:
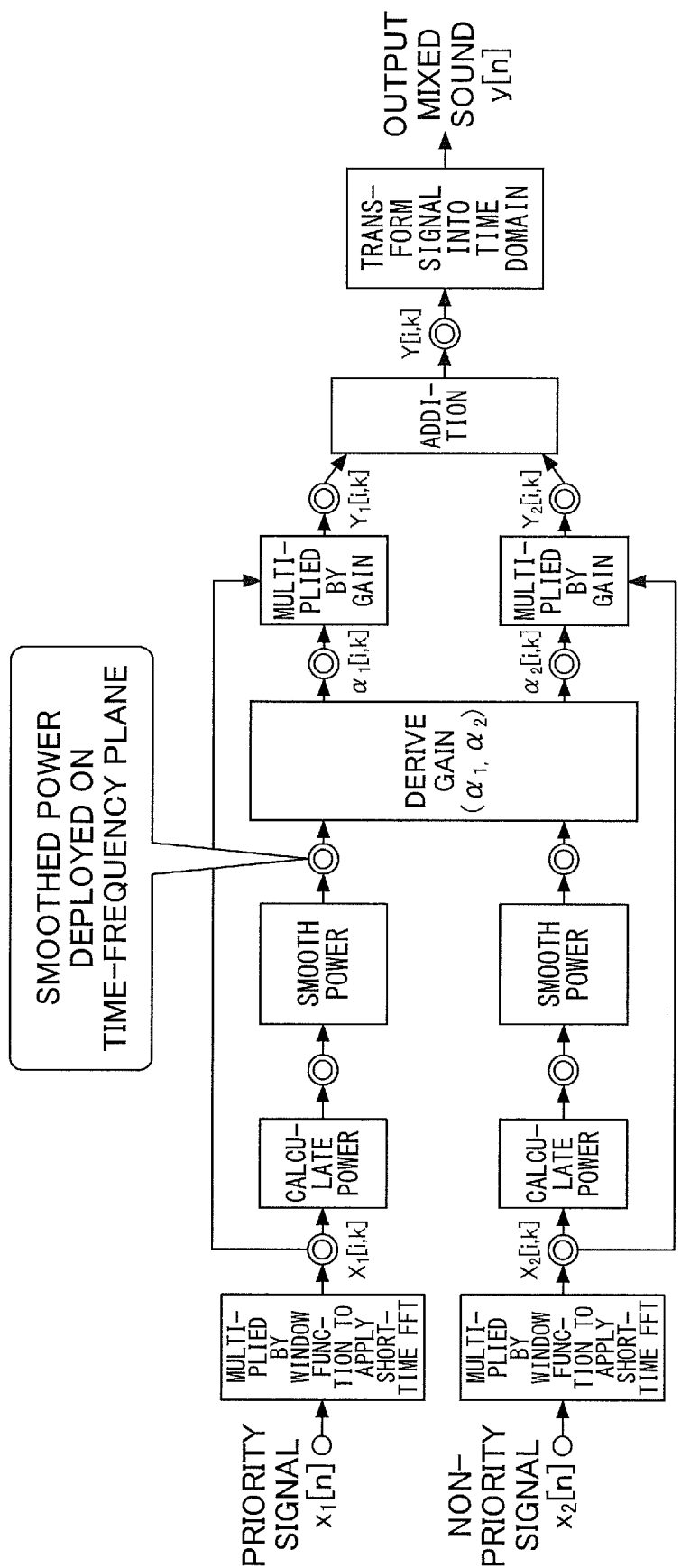
FIG. 1 is a diagram illustrating a configuration of a conventional smart mixer.
Figure 2:
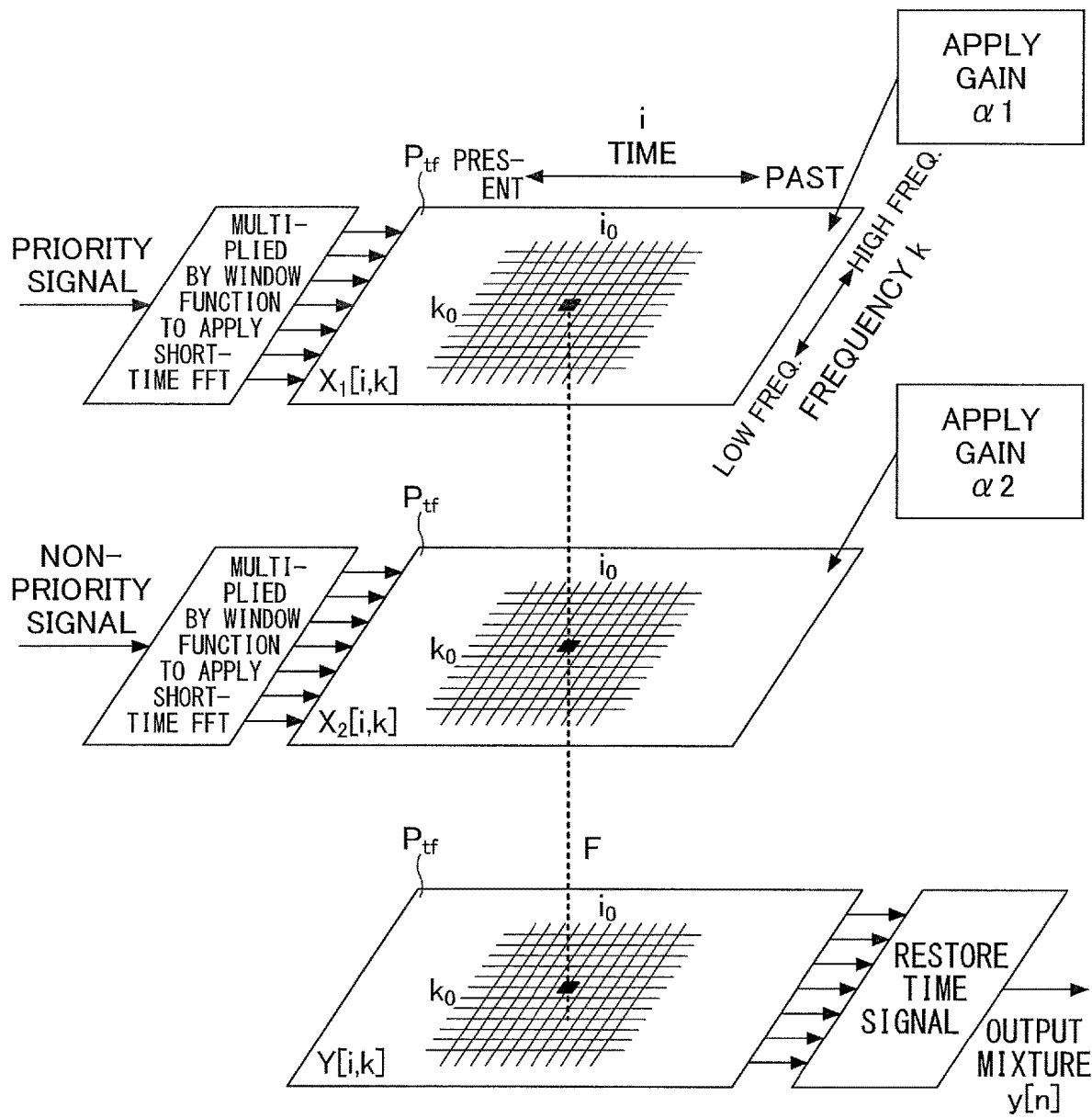
FIG. 2 is a diagram illustrating a basic concept of smart mixing.

FIG. 2 is a diagram illustrating a basic concept of smart mixing. Each of the priority sound and the non-priority sound is multiplied by a window function to apply short-time FFT (Fast Fourier Transform) to transform the sound into a signal on the frequency plane ($P_{tf}$). On the frequency plane, the priority sound and the non-priority sound are multiplied by the respective gains, and the priority sound and the non-priority sound after the gain multiplication are added (mixed). The added signal is returned to a signal in the time domain to be output.

As will be described later, the present invention has a feature of using a novel control signal to adjust the gains so as to suppress the feeling of missing non-priority sound while maintaining the clarity of priority sound. Here, the priority sound is a sound that is prioritized to be heard, such as a voice, vocal, solo part, or the like. The non-priority sound is a sound other than the priority sound, such as a background sound, accompaniment sound, or the like.

The priority sound and the non-priority sound deployed on the time-frequency plane are denoted as $X_1[i,k]$ and $X_2[i,k]$, respectively, using a coordinate value i in the time direction and a coordinate value k in the frequency direction. On the time-frequency plane, a signal obtained by multiplying the priority sound by the gain $\alpha_1$ is denoted as $Y_1[i,k]$, and a signal obtained by multiplying the non-priority sound by the gain $\alpha_2$ is denoted as $Y_2[i,k]$. A signal obtained by adding the signals $Y_1[i,k]$ and $Y_2[i,k]$ multiplied by the gains is denoted as a signal $Y[i,k]$, which represents a result of mixing. This process is expressed by Formula (1) and Formula (2).

[Expression 1]

$$Y[i,k] = \alpha_1[i,k]X_1[i,k] + \alpha_2[i,k]X_2[i,k] \quad (1)$$

$$= Y_1[i,k] + Y_2[i,k] \quad (2)$$

The signal $Y[i,k]$ representing a result of mixing is restored to a signal in the time domain, and output as a mixed sound signal $y[n]$.

The inventors have found a problem that in the case where a smart mixer for smartphones is applied as it is to a sound device that requires high-quality sound to output the sound with high volume, for example, a device for business use in a concert venue, degradation of the non-priority sound becomes noticeable. Even in the case of a smart mixer for smartphones, a listener who knows the original sound of the non-priority sound in advance may feel as if the non-priority sound is missing when carefully listening to the mixed sound generated by the smart mixer; however, in a conventional method, in order to avoid such a problem, in some cases, simple measures have been taken, such that the frequency band to which prioritized mixing is applied is limited to be higher than or equal to 350 Hz.

However, when considering mixing devices at concert venues and recording studios, it is often the case that prioritized mixing, namely, emphasis on the priority sound and suppression of the non-priority sound are desirable to be performed especially in the very bandwidth of lower than or equal to 350 Hz; therefore, the simple measures are not sufficient.

Meanwhile, the inventors analyzed phenomenon in which degradation of the non-priority sound became particularly noticeable, and found that the feeling of missing non-priority sound became noticeable in the case where the priority sound became dominant over the non-priority sound for a certain length or longer on the frequency axis.

Based on this finding, the inventors came to a conclusion that the prioritized mixing should not be continued for a certain length or longer on the frequency axis, and introduced a unique control signal. This control signal is referred to as the "vivid signal" in the present specification, which means to implement a clear mixed sound without feeling of missing non-priority sound.

The vivid signal is an indicator of whether and to what extent prioritized mixing (including suppression of non-priority sound) is applied. The vivid signal is generated so as to prevent the prioritized mixing from continuing beyond a certain bandwidth on the frequency axis, and controls the mixing so as to prevent the degradation of non-priority sound from being perceived.

Important frequency components in the priority sound are selected as a frequency band within a certain range to which the prioritized mixing is applied. For example, in the case of mixing a vocal (priority sound) with sound of the backing band (non-priority sound) at a concert venue, there is a particularly important frequency band in the vocal. Even in the case of an instrument-only session, there is an important frequency band in a part played on a particular instrument. Important frequency components may be rephrased as a band where the energy is concentrated compared to the other parts.

The "vivid signal" is generated so that prioritized mixing is applied to an important frequency band and a simple summation is applied to the other bands. The important frequency band varies depending on the music; therefore, the important frequency band of the priority sound is determined in real time during the mixing to generate the vivid signal. In other words, the vivid signal narrows passages in which only the important frequency part of the priority sound is emphasized, and the non-priority sound is attenuated. By using the vivid signal to generate a gain mask, it is possible to improve the sound quality of the non-priority sound, without spoiling the clarity of the priority sound.

Also, the smart mixing is designed to perform matching with the auditory characteristics of human beings.

First Embodiment

Figure 3:
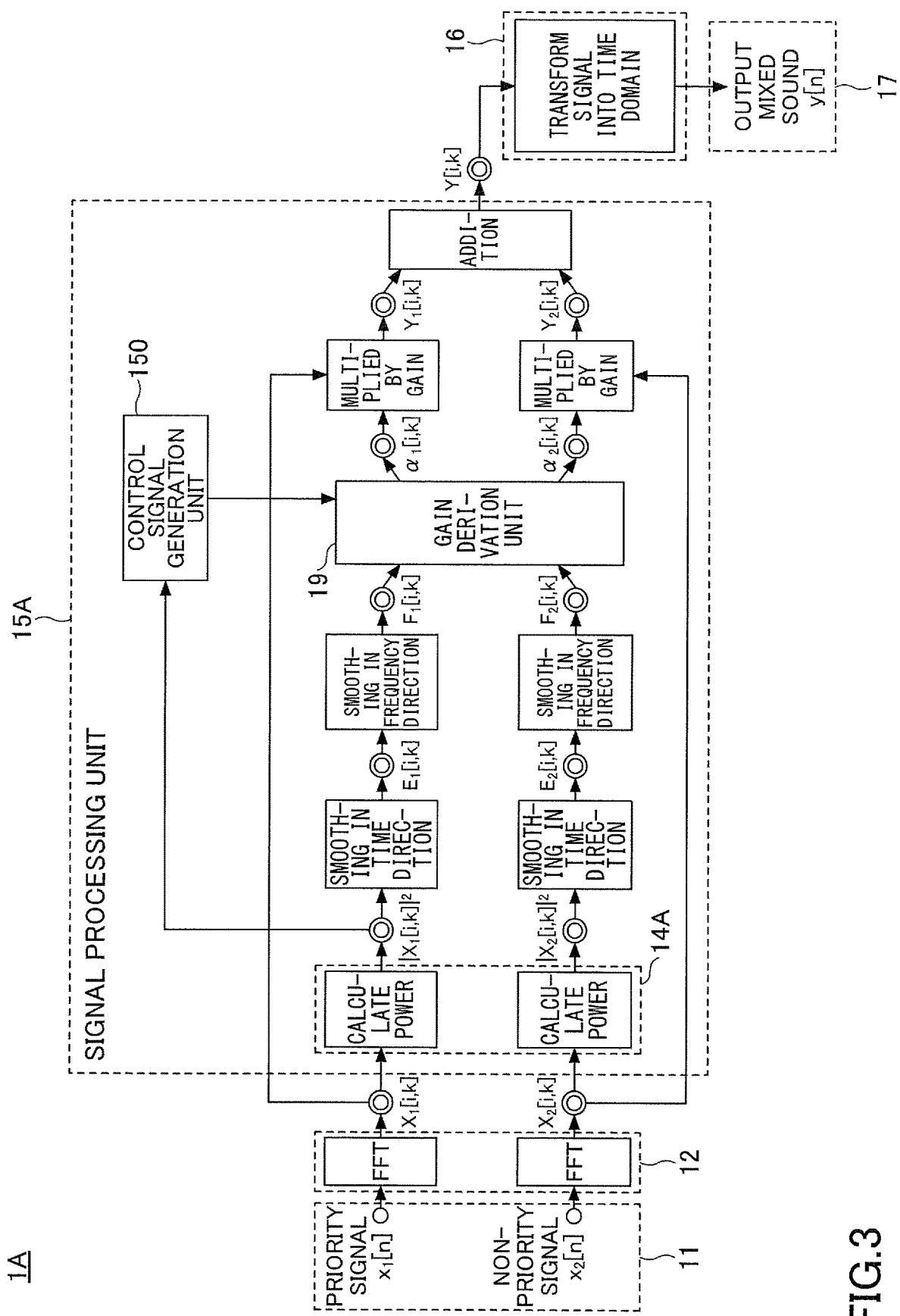
FIG. 3 is a schematic diagram of a mixing device of a first embodiment.

FIG. 3 is a schematic diagram of a mixing device 1A of a first embodiment. The mixing device 1A includes a signal input unit 11, a frequency analysis unit 12, a signal processing unit 15A, a frequency-time transformation unit 16, and a signal output unit 17. The signal input unit 11 receives multiple input signals to be mixed. The input signals are, for example, audio signals, which include a priority sound signal $x_1[n]$ such as a voice and a non-priority sound signal $x_2[n]$ such as a background sound.

The frequency analysis unit 12 deploys the input signals of the PR sound and the non-priority sound on a time-frequency plane by frequency analysis. Any method can be used for the frequency analysis, such as short-time FFT (Fast Fourier Transform), wavelet transformation, transformation by filter banks, transformation to a time-frequency distribution such as the Wigner distribution, and the like. In the embodiment, the input signals are multiplied by a window function and are deployed on the time-frequency plane by a short-time FFT. When deployed on the time-frequency plane, the priority signal is denoted as $X_1[i,k]$, and the non-priority signal is denoted as $X_2[i,k]$.

The signal processing unit 15A includes a power calculation unit 14A. The power calculation unit 14A is an example of an intensity calculation unit to calculate the intensity of an input signal deployed on the time-frequency plane. The power of an input signal is expressed as the square of the amplitude. The power calculation unit 14A calculates the power of an input signal $|X[i,k]|^2$ at each point (i,k) on the time-frequency plane. As will be described later, the input signal intensity on the time-frequency plane is not necessarily limited to the power, and may be the logarithmic intensity.

The intensity of each of the priority sound and the non-priority sound is smoothed in the time direction and in the frequency direction, and then, input into the gain derivation unit 19 to calculate a gain for each of the priority signal and the non-priority signal. The power smoothed in the time direction is denoted as $E[i,k]$, and the power smoothed in the frequency direction is denoted as $F[i,k]$.

Based on the smoothed power, the gain derivation unit 19 derives a gain $\alpha_1[i,k]$ of the priority signal and a gain $\alpha_2[i,k]$ of the non-priority signal. The gains $\alpha_1[i,k]$ and $\alpha_2[i,k]$ are determined such that, for example, the priority sound is increased within a range in which the logarithmic intensity of the mixed signal output from the mixing device 1A does not exceed the sum of the logarithmic intensity of the priority sound and the logarithmic intensity of the non-priority sound; and the non-priority sound is attenuated within a range not exceeding the increased amount of the power of the priority sound. As a specific gain calculation method, the method in Patent Document 2 may be used.

After the priority signal and the non-priority signal are multiplied by the gains $\alpha_1$ and $\alpha_2$, respectively, the multiplied values are added, and a signal $Y[i,k]$ of a result of the mixing is output from the signal processing unit 15A. The frequency-time transformation unit 16 transforms the output signal of the signal processing unit 15 into a signal $y[n]$ in the time domain. The signal output unit 17 outputs the signal that has been restored in the time domain.

As a feature of the first embodiment, the control signal generation unit 150 generates a control signal (vivid signal) that instructs whether to perform the prioritized mixing or to perform simple addition. The vivid signal is generated based on an absolute spectrum representing the absolute amount of the smoothed spectrum of the priority sound, and a relative spectrum representing local changes in the priority sound spectrum, deployed on the time-frequency plane. The gain derivation unit 19 adjusts the gains applied to the priority sound and the non-priority sound based on the vivid signal.

Figure 4:
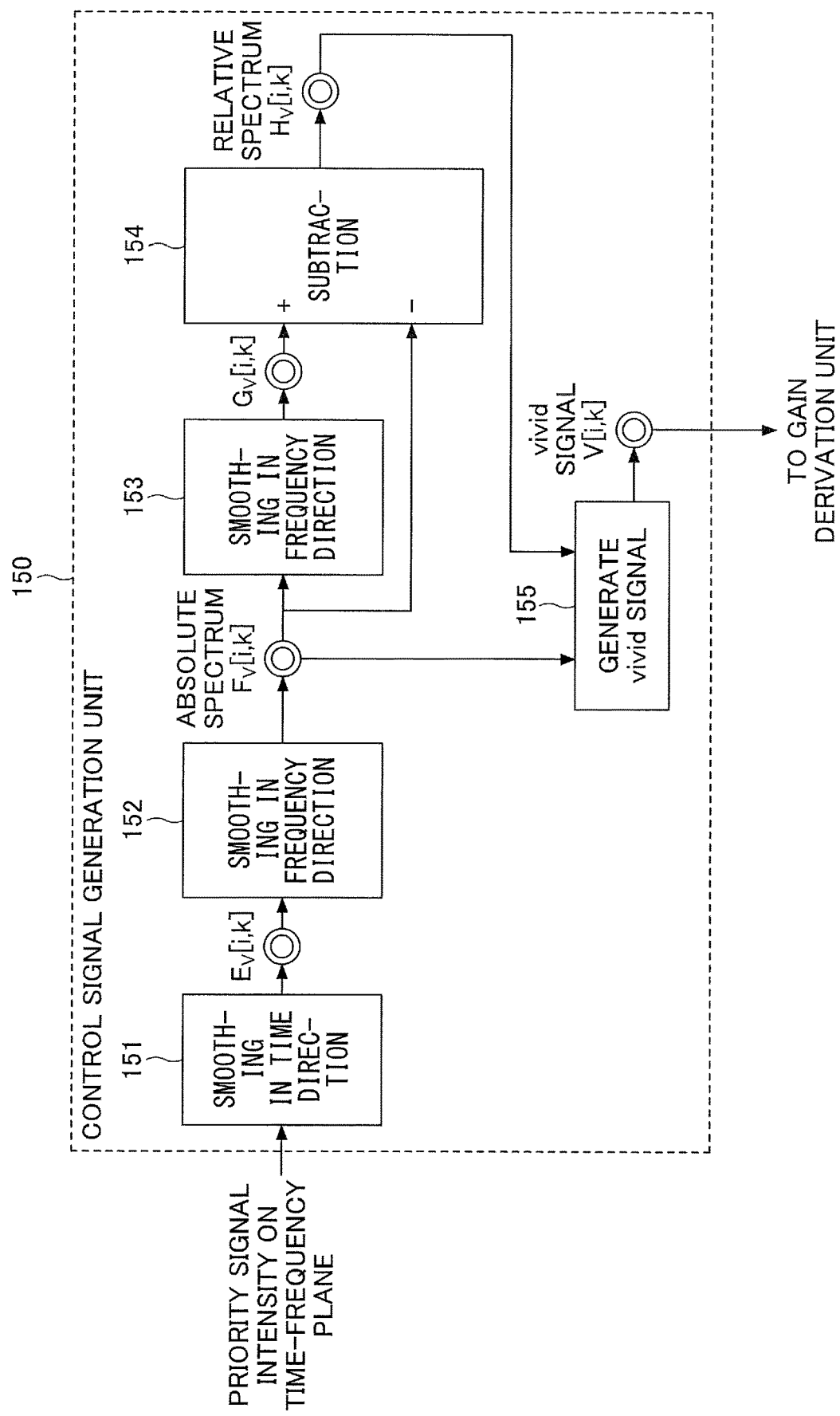
FIG. 4 is a diagram illustrating an example of a configuration of a control signal generation unit in FIG. 3.

FIG. 4 is a diagram illustrating an example of a configuration of the control signal generation unit 150 in FIG. 3. The control signal generation unit 150 includes a time-direction smoothing unit 151, a first frequency-direction smoothing unit 152, a second frequency-direction smoothing unit 153, a subtraction unit 154, and a vivid signal generator 155.

The time-direction smoothing unit 151 smooths the signal intensity of the priority sound on the time-frequency plane in the time direction, and outputs a smoothed signal $Ev[i,k]$. In the first embodiment, the power level of the priority sound is input as the signal intensity.

The first frequency-direction smoothing unit 152 smooths the signal that has been smoothed in the time direction in the frequency direction, and outputs an absolute spectrum $Fv[i,k]$. The absolute spectrum $Fv[i,k]$ is input into the second frequency-direction smoothing unit 153, to which second smoothing is applied, and is also input into the subtraction unit 154 and the vivid signal generator 155. A signal after the second smoothing is denoted as $Gv[i,k]$.

The subtraction unit 154 calculates the difference between the result of the first frequency-direction smoothing and the result of the second frequency smoothing ($Gv[i,k]-Fv[i,k]$), and feeds a relative spectrum $Hv[i,k]$ representing this difference to the vivid signal generator 155.

The vivid signal generator 155 generates a vivid signal $V[i,k]$ from the smoothed absolute spectrum $Fv[i,k]$ and the relative spectrum $Hv[i,k]$ according to a procedure that will be described later, and outputs the signal $V[i,k]$ to the gain derivation unit 19.

The vivid signal $V[i,k]$ takes at least one of two values (e.g. "0.0" and "1.0") at each point (i,k) on the time-frequency plane. For (i,k) taking $V[i,k]=0.0$, mixing is to be performed with simple addition, and for (i,k) taking $V[i,k]=1.0$, mixing is to be performed with the prioritized mixing. The simple addition herein is a process of adding the priority sound and the non-priority sound deployed on the time-frequency plane as they are, in which a gain is not multiplied or a gain whose value is 1 is multiplied.

The vivid signal $V[i,k]$ does not need to be binary necessarily, and may take any value between 0.0 and 1.0. For (i,k) that satisfies $0.0<V[i,k]<1.0$, a prioritized mixing operation that brings a reduced effect may be performed depending on the value of the vivid signal. This makes it possible to smoothly connect operations of the simple addition with operations of the prioritized mixing.

It is favorable that the vivid signal satisfies conditions considering the following two viewpoints.

The first viewpoint is a viewpoint of "suppressing the feeling of missing non-priority sound". As described above, the feeling of missing non-priority sound is particularly noticeable when the non-priority sound is suppressed continuously over a wide band on the frequency axis. Therefore, it is desirable that a band in which the vivid signal is 1.0 and a band in which the vivid signal is 0.0 are arranged alternately on the frequency axis, and that the bandwidth in which the vivid signal is 1.0 does not exceed a predetermined range.

The second viewpoint point is a viewpoint of "maintaining the effect of increasing the clarity of the priority sound as much as possible". For example, a vocal includes a variety of components, such as a formant component to cause words to be heard clearly; a band component of several kHz to cause consonants to be heard clearly; a high-frequency component necessary to prevent the sound quality from becoming muffled; a low-frequency component to prevent feeling of energy of the sound from being lost, and the like. Ideally, it is desirable to examine these frequency components from the engineering viewpoint and the music theoretical viewpoint, and to select the most important frequency band for the priority sound at the moment, so as to set the vivid signal to 1.0.

In a part corresponding to the important frequency of the priority sound, the prioritized mixing is performed based on the vivid signal indicating V[i,k]=1.0. Meanwhile, in a part in which the priority sound is not so important, the simple addition is performed based on V[i,k]=0.0. This makes it possible to suppress the degradation of the non-priority sound while maintaining the clarity of the priority sound.

However, the ideal method described above requires a number of complicated determination mechanisms including voice recognition, and a mechanism for solving an optimization problem, which make the calculation cost expensive upon implementation. Thereupon, the control signal generation unit 150 in FIG. 4 is used to determine the important frequency band in real time to generate the vivid signal at a concert venue or the like.

As described above, the time-direction smoothing unit 151 smooths the power $|X_1[i,k]|^2$ of the priority sound $X_1[i,k]$ deployed on the time-frequency plane in the time direction, to obtain the time-smoothed power Ev[i,k]. The time-smoothed power Ev[i,k] can be calculated by Formula (3).

[Expression 2]

$$E_V[i,k] = \mu_V E_V[i-1,k] + (1-\mu_V)|X_1[i,k]|^2 \quad (3)$$

where, $\mu v$ is a coefficient of an exponential smoothing method, which can be determined by Formula (4) from a smoothing time constant $\tau v$ and a sampling frequency $F_s$.

[Expression 3]

$$\mu_V = \exp\left(-\frac{N_d}{\tau_V F_s}\right) \quad (4)$$

where $N_d$ is the number of shifts of a window function ($N_d$-point shift) applied when performing short-time FFT of $N_F$ points for the priority sound and the non-priority sound obtained at the sampling frequency $F_s$.

The time-smoothed power Ev[i,k] is smoothed in the frequency direction by the first frequency-direction smoothing unit 152, to obtain Fv[i,k]. In this case, Ev[i,k] is defined only for $-N_F/2 \le k < N_F/2$ Therefore, cares should be taken for the smoothing. If the smoothing is performed with setting the undefined parts ($k \le N_F/2$ and $N_F/2 \le k$) to zero, there may be a case where the absolute spectrum Fv[i,k] decreases significantly with respect to $|k| \approx N_F/2$. Thereupon, for the undefined parts of Ev[i,k], it is favorable to extend the domain as in Formula (5) and Formula (6) before performing the smoothing.

[Expression 4]

$$E_V[i,k] \leftarrow E_V[i, N_F - k] \quad (k \ge N_F/2) \quad (5)$$

$$E_V[i,k] \leftarrow E_V[i, -N_F - k] \quad (k < -N_F/2) \quad (6)$$

By performing the smoothing in the frequency direction for Ev[i,k] extended in this way (first frequency-direction smoothing), the absolute spectrum Fv[i,k] is obtained. Fv[i,k] is expressed by Formula (7).

[Expression 5]

$$F_V[i,k] = \sum_{j=-N_A}^{N_A} f(j) E_V[i, k+j] \quad (7)$$

where f( ) is the weight factor of the smoothing, and $N_A$ is the width of the smoothing.

The second frequency smoothing is performed for Fv[i,k], to obtain Gv[i,k]. Gv[i,k] is expressed by Formula (8).

[Expression 6]

$$G_V[i,k] = \sum_{j=-N_A}^{N_A} g(j) F_V[i, k+j] \quad (8)$$

where g( ) is the weight factor of the smoothing. The first frequency smoothing and the second frequency smoothing may be performed by storing a coefficient table of f( ) and g( ) in the memory of the mixing device 1A, and performing multiplication by the coefficients. In the case of implementing the calculation processing of the mixing device 1A on a logic device such as an FPGA (Field Programmable Gate Array), a memory area built in the FPGA may be used.

Instead of application of the weight coefficient, substantially the same effect as that obtained by a Gaussian type, namely, obtained by using f( ) and g( ) can be obtained by a cascaded connection of summation over a predetermined interval, for example, by performing the calculation of Formulas (9) to (12).

[Expression 7]

$$E_V^{(1)}[i,k] = \sum_{j=-N_A/4}^{N_A/4} E_V[i, k+j] \quad (9)$$

$$E_V^{(2)}[i,k] = \sum_{j=-N_A/4}^{N_A/4} E_V^{(1)}[i, k+j] \quad (10)$$

$$E_V^{(3)}[i,k] = \sum_{j=-N_A/4}^{N_A/4} E_V^{(2)}[i, k+j] \quad (11)$$

$$F_V[i,k] = \sum_{j=-N_A/4}^{N_A/4} E_V^{(3)}[i, k+j] \quad (12)$$

This method requires no multiplier, and hence, is particularly advantageous in the case of implementing the smart mixing on an FPGA.

Next, by taking the difference between Fv[i,k] and Gv[i,k], the relative spectrum Hv[i,k] expressed as Formula (13) is obtained.

[Expression 8]

$$H_V[i,k] = F_V[i,k] - G_V[i,k] \quad (13)$$

The power Fv[i,k] after the first frequency-direction smoothing can be considered to represent the absolute amount of the spectrum, and Fv[i,k] is referred to as the absolute spectrum. Meanwhile, the power Gv[i,k] after the second frequency-direction smoothing represents a global outline of Fv[i,k].

Hv[i,k] defined by the difference between Fv[i,k] and Gv[i,k] can be interpreted to represent the relative irregularities (changes) of Fv[i,k] when focusing on local regions on the frequency axis. Thereupon, Hv[i,k] is referred to as the relative spectrum.

Here, the behavior of the relative spectrum Hv[i,k] will be considered. For example, at a formant frequency to cause words to be heard clearly, Hv[i,k] is expected to be positive. Also, at a frequency in a gap between a formant and a formant, Hv[i,k] is expected to be negative. Even in the case of the sound of a musical instrument, Hv[i,k] is expected to be positive at important frequencies where the energy is relatively concentrated, and Hv[i,k] is expected to be negative in a gap region between an important frequency and an important frequency.

First, as a candidate of the vivid signal, consider a signal $V_H[i,k]$ of Formula (14) from the relative spectrum.

[Expression 9]

$$V_H[i,k] = \begin{cases} 0.0 & (H_V[i,k] < H_L[k]) \\ 1.0 & (H_V[i,k] \geq H_H[k]) \\ \dfrac{H_V[i,k] - H_L[k]}{H_H[k] - H_L[k]} & (\text{othewise}) \end{cases} \quad (14)$$

In the case where the relative spectrum Hv[i,k] at a point (i,k) on the time-frequency plane is less than a constant threshold value $H_L[k]$, the signal is set as $V_H[i,k]=0.0$. In the case where the relative spectrum Hv[i,k] is greater than or equal to a constant threshold value $H_H[k]$ (i.e., in the case of high energy), the signal is set as $V_H[i,k]=1.0$. In the case where the relative spectrum Hv[i,k] is greater than or equal to the threshold value $H_L[k]$ and less than $H_H[k]$, a value greater than or equal to 0.0 and less than 1.0 is given depending on the value of the relative spectrum at that position.

For example, as the simplest setting, if $H_L[k]=H_H[k]=0$ is adopted, a band in which $V_H[i,k]$ is 1.0 and a band in which $V_H[i,k]$ is 0.0 tend to appear alternately within a certain interval, and thereby, the above-described condition of "suppressing the feeling of missing non-priority sound" (first viewpoint) is nearly satisfied. Also, $V_H[i,k]$ is expected to be 1.0 at the formant frequency, and thereby, the other condition of "maintaining the effect of increasing the clarity of the priority sound as much as possible" (second viewpoint) is satisfied. Therefore, $V_H[i,k]$ is a good candidate for the vivid signal.

However, if $V_H[i,k]$ defined as in Formula (14) is used as the vivid signal as it is, even in the case where the priority sound intensity is extremely small (e.g., in the case where the sound of a backing band when a vocal is silent is mixed into a microphone for the vocal), the vivid signal may become 1.0.

Thereupon, $V_F[i,k]$ is obtained from the absolute spectrum by Formula (15).

[Expression 10]

$$V_F[i,k] = \begin{cases} 0.0 & (F_V[i,k] < F_L[k]) \\ 1.0 & (F_V[i,k] \geq F_H[k]) \\ \dfrac{F_V[i,k] - F_L[k]}{F_H[k] - F_L[k]} & (\text{othewise}) \end{cases} \quad (15)$$

In Formula (15), in the case where the absolute spectrum Fv[i,k] is smaller than a constant threshold value $F_L[k]$, $V_F[i,k]$ is set to 0.0 assuming that no priority sound is vocalized at the point (i,k) on the time-frequency plane; and in the case where the absolute spectrum Fv[i,k] is greater than or equal to a constant threshold value $F_H[k]$, $V_F[i,k]$ is set to 1.0 assuming that the priority sound is vocalized. When the absolute spectrum Fv[i,k] is located between the two threshold values, $V_H[i,k]$ takes a value greater than 0.0 and less than 1.0, depending on the value of the absolute spectrum at that position.

Under the preparation described above, the vivid signal V[i,k] is defined as the minimum value among $V_F[i,k]$ and $V_H[i,k]$ (the smaller value among the two) as expressed in Formula (16).

[Expression 11]

$$V[i,k] = \min(V_F[i,k], V_H[i,k]) \quad (16)$$

A vivid signal generated by the vivid signal generator 155 according to Formula (16) is used for switching between the prioritized mixing and the simple addition in the gain derivation unit 19. Specifically, this switching is implemented by the following method.

As the parameters of the smart mixer, an upper limit $T_{1H}$ of the gain $\alpha_1$ of the priority sound, and a lower limit $T_{2L}$ of the gain $\alpha_2$ of the non-priority sound are set. These are based on the "principle of fill-in" that emphasizes the priority sound within a range that does not exceed a predetermined threshold value, and suppresses the non-priority sound within a range that does not exceed a predetermined threshold value. These threshold values are redefined for each point (i,k) on the time-frequency plane, as in Formula (17) and Formula (18).

[Expression 12]

$$T_{1H}[i,k] \leftarrow V[i,k](T_{1H} - 1.0) + 1.0 \quad (17)$$

$$T_{2L}[i,k] \leftarrow V[i,k](T_{2L} - 1.0) + 1.0 \quad (18)$$

Using the upper limit $T_{1H}$ and the lower limit $T_{2L}$ of the gain that have been adjusted, the prioritized mixing is performed when V[i,k]=1.0, and the simple addition is performed when V[i,k]=0.0. Between the simple addition and the prioritized mixing, the degree of prioritized mixing varies depending on the value of V[i,k], and hence, it is possible to smoothly connect the prioritized mixing with the simple addition. Note that the gain $\alpha_1$ for the priority sound is obtained by increasing $\alpha_1$ in the previous time frame (i−1) by a predetermined step size within a range not exceeding the adjusted upper limit $T_{1H}$. The gain $\alpha_2$ for the non-priority sound is obtained by reducing $\alpha_2$ in the previous time frame (i−1) by a predetermined step size within an extent not to be less than $T_{2L}$.

The vivid signal determines whether to perform the prioritized mixing, and when performing the prioritized mixing, the priority sound is added with the non-priority sound by using the gains $\alpha_1$ and $\alpha_2$ calculated within reasonable ranges. The mixed signal restored in the time domain reproduces a natural sound in which the priority sound is emphasized and the non-priority sound is felt with a sufficient volume.

Second Embodiment

Figure 5:
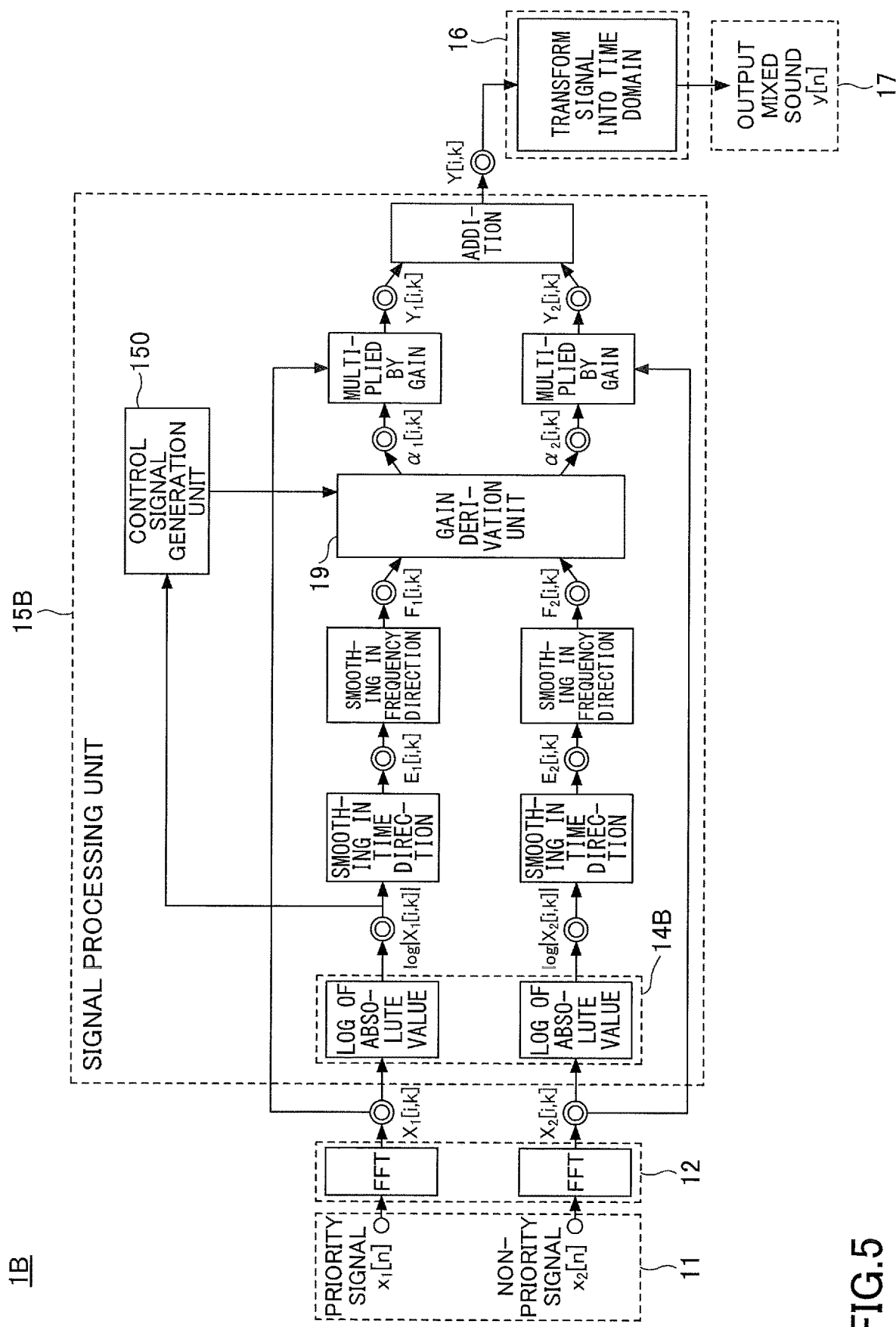
FIG. 5 is a schematic diagram of a mixing device of a second embodiment.

FIG. 5 is a schematic diagram of a mixing device 1B of a second embodiment. The same elements as in the mixing device 1A of the first embodiment are attached with the same reference symbols, to omit duplicate descriptions. In the first embodiment, the vivid signal is generated based on the power (square of the amplitude) of the priority sound deployed on the time-frequency plane. In the second embodiment, the vivid signal is generated based on the logarithm of the absolute value of the priority sound deployed on the time-frequency plane.

If evaluating the priority sound and the non-priority sound by the power $|X_1[i,k]|^2$ and $|X_1[i,k]|^2$ as in the first embodiment, taking the square doubles the bit length. In the case of implementing the smart mixer with a logic device such as an FPGA, the processing amount increases.

Meanwhile, in the case where a graphical display device is provided on the smart mixer to display the power on the time-frequency plane either in shade or in pseudo colors, logarithmic calculation is performed. If the logarithmic calculation is performed for displaying, calculation related to the intensity becomes simpler by performing the calculation using logarithm (with dB notation) from the outset.

The mixing device 1B includes a signal input unit 11, a frequency analysis unit 12, a signal processing unit 15B, a frequency-time transformation unit 16, and a signal output unit 17. The signal input unit 11 receives as input the priority signal and the non-priority signal to be mixed. The signals $X_1[i,k]$ and $X_2[i,k]$ each deployed on the time-frequency plane by the frequency analysis unit 12, are input into the signal processing unit 15B.

The signal processing unit 15B includes a logarithmic intensity calculation unit 14B as an intensity calculation unit. The logarithmic intensity calculation unit 14B calculates norms $|X_1[i,k]|$ and $|X_2[i,k]|$ of the input complex-valued signals $X_1[i,k]$ and $X_2[i,k]$ by using, for example, a CORDIC method; and then, performs logarithmic calculation, for example, by referring to a table stored in the memory or the like, to calculate a logarithmic intensity log $|X_1[i,k]|$ of the priority sound and a logarithmic intensity log $|X_2[i,k]|$ of the non-priority sound.

The logarithmic intensity of each of the priority sound and the non-priority sound is smoothed in the time direction and in the frequency direction, and then, input into the gain derivation unit 19; the gain derivation unit 19 calculates a gain for each of the priority signal and the non-priority signal. The logarithmic intensity smoothed in the time direction is denoted as E[i,k], and the logarithmic intensity smoothed in the frequency direction is denoted as F[i,k].

Based on the smoothed logarithmic intensity and the vivid signal from the control signal generation unit 150, the gain derivation unit 19 derives a gain $\alpha_1[i,k]$ of the priority signal and a gain $\alpha_2[i,k]$ of the non-priority signal. The gains $\alpha_1[i,k]$ and $\alpha_2[i,k]$ are determined so as to increase the priority sound and to attenuate the non-priority sound within a range not exceeding the upper limit and the lower limit defined by Formula (17) and Formula (18) in a certain important frequency band.

The priority signal and the non-priority signal are multiplied by the gains $\alpha_1$ and $\alpha_2$, respectively, which are then added, to output a signal Y[i,k] as the result of mixing from the signal processing unit 15B. The frequency-time transformation unit 16 transforms the output signal of the signal processing unit 15 into a signal y[n] in the time domain. The signal output unit 17 outputs the signal that has been restored in the time domain.

In the second embodiment, the logarithmic intensity log $|X_1[i,k]|$ of the priority sound is input into the control signal generation unit 150 to generate a vivid signal that controls derivation of the gain. The configuration of the control signal generation unit 150 is the same as the configuration in FIG. 4. The difference is that the signal intensity input into the time-direction smoothing unit 151 is not the power of the priority sound on the time-frequency plane, but a logarithmic value of the amplitude of the priority sound.

The operations of the time-direction smoothing unit 151 and thereafter are the same as those in the first embodiment. That is, the logarithmic intensity that has been input is smoothed in the time direction and in the frequency direction to generate a smoothed spectrum (absolute spectrum). The absolute spectrum is further smoothed in the frequency direction to generate a relative spectrum that represents local changes on the frequency axis based on the difference with the absolute spectrum. The vivid signal generator 155 generates and outputs a vivid signal according to the smaller one of a signal value based on the absolute spectrum based and a signal value based on the relative spectrum.

The gain derivation unit 19 generates gains $\alpha_1$ and $\alpha_2$ based on the smoothed logarithmic values of the priority sound and the non-priority sound, and the vivid signal. The priority sound and the non-priority sound as the input signals are multiplied by the gain $\alpha_1$ and $\alpha_2$, respectively, and the multiplied values are added; then, a signal Y[i,k] of a result of the mixing is output from the signal processing unit 15B. The signal Y[i,k] is restored as a signal in the time domain by the frequency-time transformation unit 16, to be output from the signal output unit 17.

Note that both of the signal E[i,k] smoothed in the time direction and the signal F[i,k] smoothed in the frequency direction in FIG. 5 are new variables using the logarithmic intensity, and take values different from those of the signals E[i,k] and F[i,k] illustrated in FIG. 3 in the first embodiment. Also, the time-direction smoothed signal Ev[i,k], the absolute spectrum Fv[i,k], the relative spectrum Hv[i,k], and the like generated by the control signal generation unit 150 are also based on the same calculation method, but take different values.

Human beings have an auditory characteristic of perceiving the magnitude of power logarithmically; therefore, by setting the longitudinal axis of smoothing to be based on values of the logarithmic intensity rather than the power, mixing conformant with the sense of listeners can be performed.

Third Embodiment

In the third embodiment, when smoothing in the frequency direction, auditory characteristics of human beings are reflected. In the embodiment, in order to generate a vivid signal, an absolute spectrum Fv[i,k] is obtained by the first frequency-direction smoothing, and a spectrum Gv[i,k] representing a global outline is obtained by the second frequency-direction. Fv[i,k] and Gv[i,k] are obtained by Formula (7) and Formula (8), respectively, as described above.

When smoothing is performed by Formula (7) and Formula (8), the effect of the smoothing is identical at all positions on the frequency axis. However, the auditory filter of human beings has characteristics of being narrower at lower frequencies and of being wider at higher frequencies. In other words, the auditory resolution is higher in a lower frequency band and lower in a higher frequency band.

If attempting to match the smoothing process in the frequency direction with the auditory characteristics of human beings, it is desirable that f( ) in Formula (7) and g( ) in Formula (8) have frequency dependence. However, if attempting to implement such frequency dependence, not only the additional capacity of the memory for storing the data is required, but also the calculation of Formula (9) to (12) using only adders cannot be used, and the calculation load becomes larger.

Meanwhile, as frequency scales that take into account the characteristics of the auditory filter of human beings, the Bark scale, the Equivalent Rectangular Bandwidth (ERB) scale, and the like have been known. The range on the Bark scale extends from 1 to 24, which correspond to 24 critical bands of hearing. The frequency axis based on the Bark scale is referred to as the Bark axis, and the frequency axis based on the ERB scale is referred to as the ERB axis. By configuring a time-frequency plane using these axes, the smoothing process according to Formula (7) and Formula (8) matches the auditory characteristics of human beings even if not implementing frequency dependence in f( ) and g( ) In other words, narrower smoothing is performed at lower frequencies and wider smoothing is performed at higher frequencies. Thereupon, the frequency axis is transformed before the smoothing.

Figure 6:
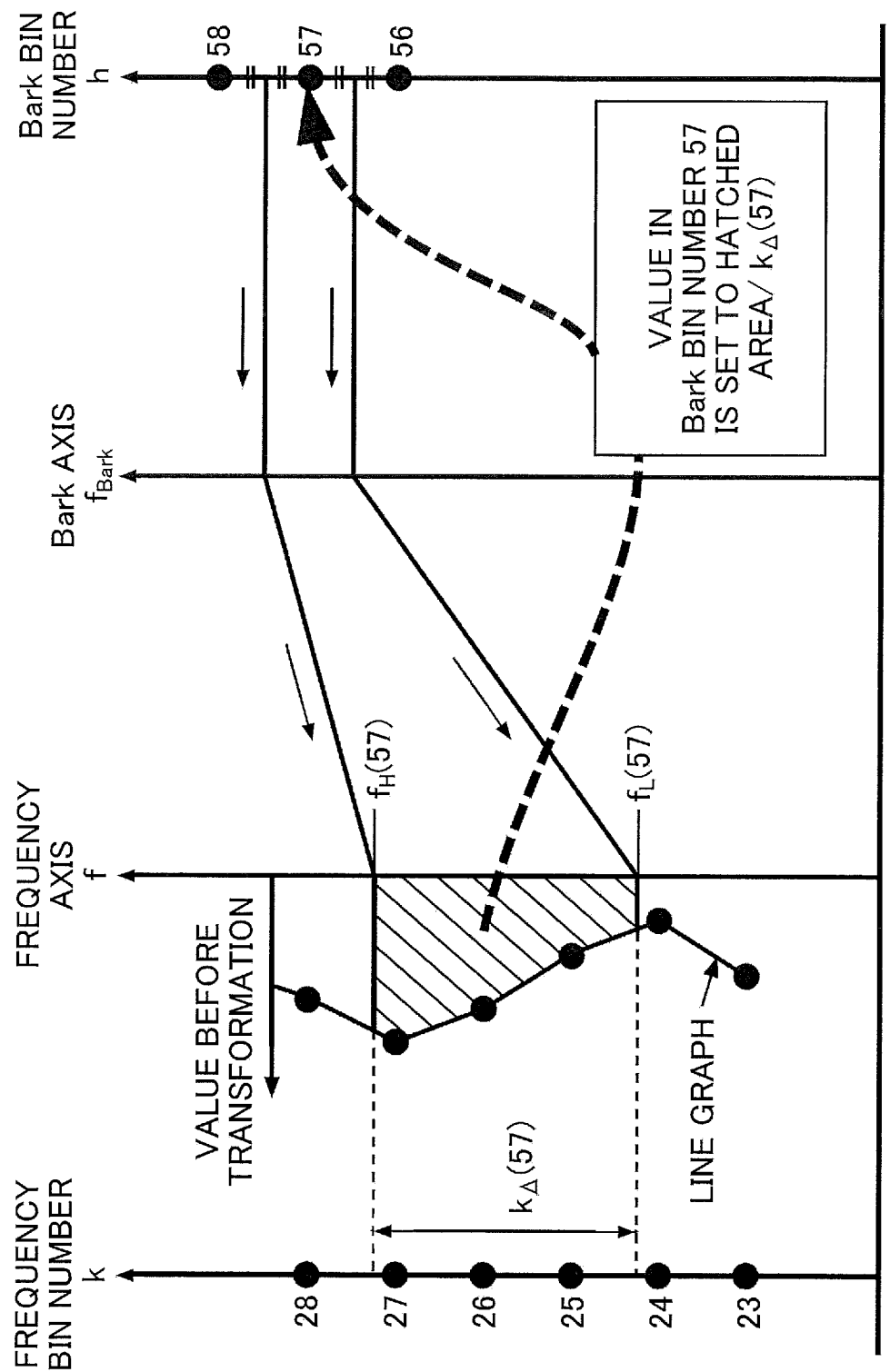
FIG. 6 is a diagram illustrating transformation of high frequencies onto the Bark axis in a third embodiment.
Figure 7:
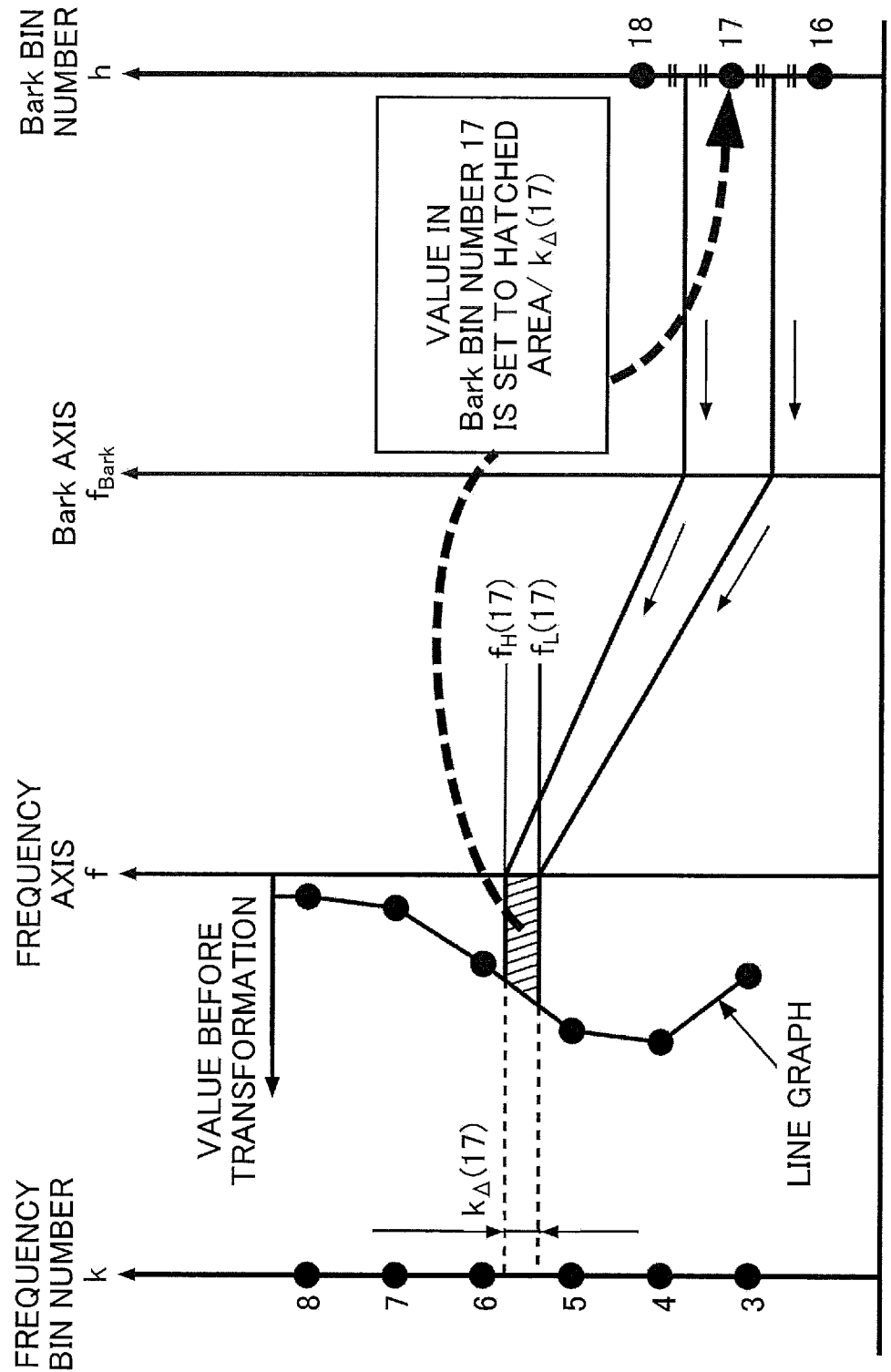
FIG. 7 is a diagram illustrating transformation of low frequencies onto the Bark axis in a third embodiment.

FIG. 6 is a diagram illustrating transformation to the Bark axis at high frequencies; and FIG. 7 is a diagram illustrating transformation to the Bark axis at lower frequencies. With reference to FIGS. 6 and 7, transformation of data from the linear frequency axis to the Bark axis will be described. In FIGS. 6 and 7, a longitudinal axis second from the left is the linear frequency axis f, and the leftmost longitudinal axis is the bin number k of the linear frequency axis. A longitudinal axis third from the left is the Bark axis $f_{Bark}$. The rightmost longitudinal axis is the Bark bin number h. The correspondence between bins on the f-axis and bins on the Bark axis ($f_{Bark}$) may be one-to-one, many-to-one, or one-to-many, depending on the frequency band.

Denoting a transformation function from the frequency f on the linear axis to the frequency $f_{Bark}$ on the Bark axis by $J_B( )$ this transformation is expressed as in Formula (19) and Formula (20).

[Expression 13]

$$f_{Bark} = J_B(f) \qquad (19)$$

$$= 13\arctan(0.00076f) + 3.5\arctan((f/7500)^2) \qquad (20)$$

Assume that the frequency components of the linear axis data from 0 to $F_s/2$ [Hz] appear in the ($N_F/2+1$) frequency bins having bin numbers 0 to $N_F/2$. Also assume that, among these, frequency components from 0 to $F_B$[Hz] are transformed onto the Bark axis, to appear in ($N_B+1$) Bark bins having bin numbers 0 to $N_B$.

The transformation may be performed by a simple method of using, as it is, data of a frequency bin number k on the linear frequency axis that is closest to a frequency corresponding a Bark bin number h. However, this method may result in repeatedly referring to the same data of k when h is small. Also, when h is larger, some values of k may be skipped. Consequently, there may be cases where the smoothness of values on the time-frequency plane is lost. Thereupon, the processing in FIGS. 6 and 7 is performed to make the data on the time-frequency plane on the Bark axis smooth.

First, denoting the lower limit and the upper limit of the linear frequency domain corresponding to the h-th Bark bin by $f_L(h)$ and $f_L(h)$, respectively, the lower limit and the upper limit are expressed as in Formula (21) and Formula (22).

[Expression 14]

$$f_L(h) = J_B^{-1}\left(\frac{h - 0.5}{N_B} J_B(F_B)\right) \qquad (21)$$

$$f_H(h) = J_B^{-1}\left(\frac{h + 0.5}{N_B} J_B(F_B)\right) \qquad (22)$$

Referring to FIG. 6, corresponding to the 57th Bark bin, $56.5/N_B$ is used as the coefficient for determining the lower limit, and $57.5/N_B$ is used as the coefficient for determining the upper limit.

Meanwhile, the frequency corresponding to the k-th linear frequency bin is $kF_s/N_F$[Hz]; therefore, a line graph can be drawn as illustrated in FIG. 6, by deploying the data before the transformation on the frequency axis. The line graph represents the signal intensity (power or logarithmic intensity) on the linear frequency axis. In a region between the line graph and the linear frequency axis f, the area of a hatched region sandwiched between the upper limit $f_L(57)$ and the lower limit $f_L(57)$ is calculated. By dividing this area by an interval $k_A(57)$ on the linear frequency axis, the bin number of the linear frequency f corresponding to the Bark bin number h=57 is obtained, where $k_A(h)=N_F/F_s(f_L(h)-f_L(h))$.

In a high frequency domain as illustrated in FIG. 6, although one value of h on the Bark axis refers to many values of k on the linear frequency axis, the transformation process described above can implement smooth transformation.

In a low frequency domain as illustrated in FIG. 7, although multiple values of h refer to a single interval, namely, an interval between k and k+1, also in this case, the method described above can implement smooth transformation. In other words, in the case where the Bark bin h is 17, the area of a hatched region between an upper limit of $f_L(17)$ and a lower limit of $f_L(17)$ is calculated, and this area is divided by $k_A(17)$. In this way, the bin number of the linear frequency f corresponding to the Bark bin number h=17 is obtained.

The calculation of frequency transformation described above can also be easily performed on an FPGA, by determining in advance a calculation method in which for each Bark bin number h, values of k to be added with weights are defined, and by storing the method as a table.

Note that the inverse transformation (a process of returning from the Bark axis to the linear axis) can also be expressed by calculation in the inverse direction with the same method.

Figure 8:
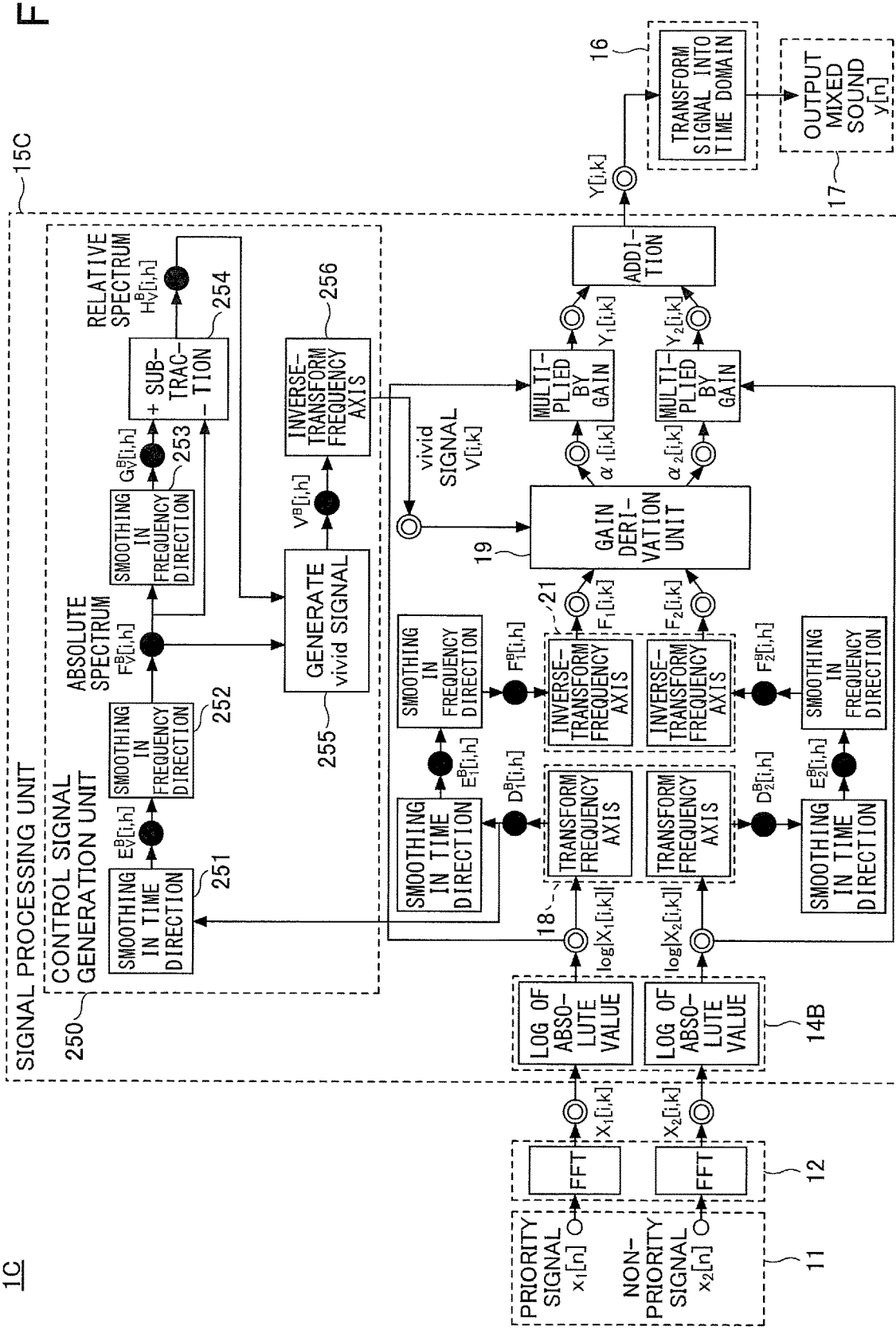
FIG. 8 is a schematic diagram of a mixing device of the third embodiment.

FIG. 8 is a schematic diagram of a mixing device 1C of the third embodiment. The same elements as in the first and second embodiments are attached with the same reference symbols, to omit duplicate descriptions. The mixing device 1C includes a signal input unit 11, a frequency analysis unit 12, a signal processing unit 15C, a frequency-time transformation unit 16, and a signal output unit 17. The configurations and operations of the signal input unit 11, the frequency analysis unit 12, the frequency-time transformation unit 16, and the signal output unit 17 are the same as in the first and second embodiments.

In addition to the smoothing units, multipliers, adders, and the like, the signal processing unit 15C includes a logarithmic intensity calculation unit 14B as an intensity calculation unit, a frequency axis transformation unit 18, a frequency axis inverse-transformation unit 21, a gain derivation unit 19, and a control signal generation unit 250. In the signal processing unit 15C, a double circle (◎) designates a signal on the linear frequency axis, and a black circle (●) designates a signal on the Bark axis.

In the signal processing unit 15C, the logarithmic intensity calculation unit 14B calculates the logarithmic intensity of the priority sound log |X$_1$[i,k]| and the logarithmic intensity of the non-priority sound log |X$_2$[i,k]| from complex-values signals X$_1$[i,k] and X$_2$[i,k] received as input, respectively.

The logarithmic intensities log |X$_1$[i,k]| and log |X$_2$[i,k]| of the priority sound and the non-priority sound are transformed onto a frequency axis that matches the auditory scale of human beings (e.g., Bark axis) by the frequency axis transformation unit 18. Each of the logarithmic intensities D$_1^B$[i,h] and D$_2^B$[i,h] of the priority sound and the non-priority sound transformed onto the Bark axis is smoothed in the time direction and in the frequency direction, and then, returned to smoothed signals F$_1$[i,k] and F$_2$[i,k] on the linear frequency axis by the frequency axis inverse-transformation unit 21 before input into the gain derivation unit 19.

Meanwhile, the logarithmic intensity D$_1^B$[i,h] of the priority sound on the Bark axis is input into the control signal generation unit 250, and used for generating a vivid signal. The time-direction smoothing unit 251 smooths the logarithmic intensity D$_1^B$[i,h] of the priority sound on the Bark axis in the time direction, and outputs a time-direction smoothed signal E$_V^B$[i,h]. The first frequency-direction smoothing unit 252 smooths the signal that has been smoothed in the time direction in the frequency direction, and outputs an absolute spectrum F$_V^B$[i,h].

The second frequency-direction smoothing unit 253 further smooths the signal that has been smoothed in the frequency direction, and outputs a spectrum G$_V^B$[i,h] representing a global outline of the absolute spectrum F$_V^B$[i,h]. The subtraction unit 254 calculates the difference between the absolute spectrum and the relative spectrum, and outputs a relative spectrum H$_V^B$[i,h].

The absolute spectrum F$_V^B$[i,h] and the relative spectrum H$_V^B$[i,h] are input into the vivid signal generator 255, and a control signal V$^B$[i,h] on the Bark axis is output from the vivid signal generator 255. The frequency axis inverse-transformation unit 356 returns the control signal V$^B$[i,h] onto the linear frequency axis, and then, supplies the vivid signal V[i,k] to the gain derivation unit 19.

In the control signal generation unit 250, frequency-direction smoothing is performed twice on the Bark axis (alternatively, on another auditory scale axis such as the ERB), and then, the vivid signal is generated; therefore, it is possible to generate a control signal that is more attuned to hearing of human beings. In the case of connecting a graphical display device to display the power on the time-frequency plane either in shade or in pseudo colors, it can be displayed on the Bark axis; therefore, the processing can be performed efficiently.

Figure 9:
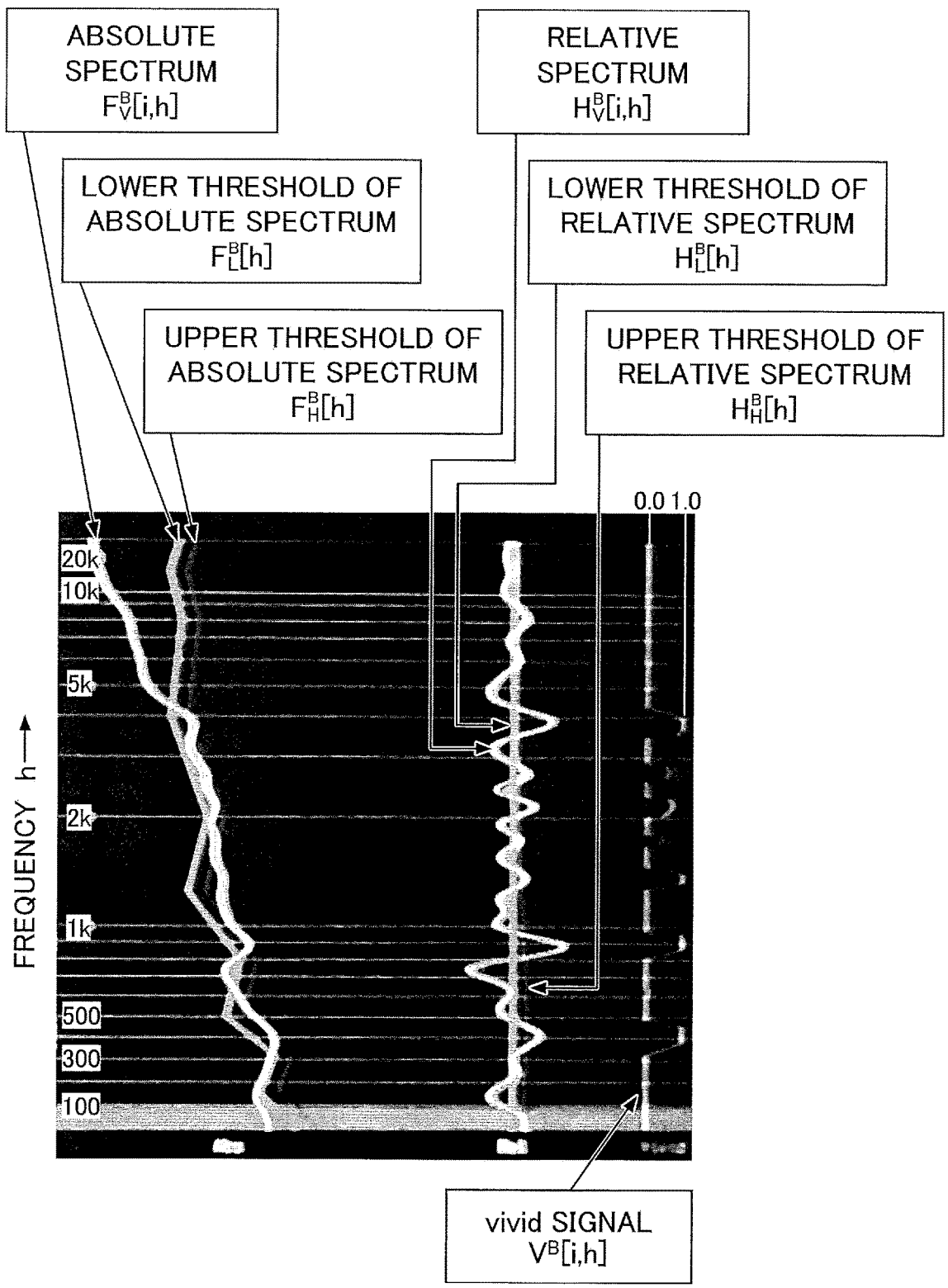
FIG. 9 illustrates a monitor screen when a control signal is generated on the Bark axis.

FIG. 9 illustrates a monitor screen when a control signal is generated on the Bark axis. Three spectra on the left side in FIG. 9 are the absolute spectrum F$_V^B$[i,h] on the Bark axis, its lower threshold value F$_L^B$[i,h], and its upper threshold value F$_V^B$[i,h]. Three spectra in the center are the relative spectrum H$_V^B$[i,h] on the Bark axis, its lower threshold value H$_L^B$[i,h], and its upper threshold value H$_L^B$[i,h]. The spectrum on the right side in FIG. 9 is the vivid signal V$^B$[i,h] to be output. The vivid signal takes a value within a range of 0.0 to 1.0.

Depending on the position of the absolute spectrum F$_V^B$[i,h] with respect to the lower threshold value F$_L^B$[i,h] and the upper threshold value F$_V^B$[i,h], the vivid signal V$^B$[i,h] as a result of evaluation of the local energy concentration is determined. For example, if the absolute spectrum F$_V^B$[i,h] is less than the lower threshold value F$_L^B$[i,h], there is no locally concentrated energy; therefore, in order to perform the simple addition, the value of the vivid signal is set to 0.0. If the absolute spectrum F$_V^B$[i,h] is greater than or equal to the upper threshold value F$_V^B$[i,h], in order to emphasize the energy concentration (priority sound) and to suppress the degradation of the non-priority sound so as to perform the prioritized mixing, the value of the vivid signal is tentatively set to 1.0 (see Formula (15)). In the other cases, the vivid signal takes an intermediate value depending on the value of the absolute spectrum.

The upper threshold value F$_L^B$[i,h] and the lower threshold value F$_L^B$[i,h] of the absolute spectrum[i,h] vary in magnitude depending on the frequency band. In a high frequency domain, noise energy is relatively low; therefore, the threshold value is set to be low. In a low frequency domain, noise energy is relatively high; therefore, the threshold value is set to be high.

Next, focusing on the relative spectrum H$_V^B$[i,h], in the case where the relative spectrum H$_V^B$[i,h] is smaller than the lower limit threshold value H$_L^B$[i,h], the value of the vivid signal is set to 0.0, and in the case of being greater than or equal to the upper limit threshold value H$_L^B$[i,h], the value of the vivid signal is tentatively set to 1.0 (see Formula (14)). In the other cases, the vivid signal takes an intermediate value depending on the value of the relative spectrum. If the interval between the upper threshold value H$_V^B$[i,h] and the lower threshold value H$_L^B$[i,h] approaches zero, the tentative values of the vivid signal practically corresponds to binary values.

The vivid signal V$^B$[i,h] to be output finally takes the smaller one of the vivid signal based on the relative spectrum and that based on the absolute spectrum (see Formula (16)). When both of the vivid signal based on the relative spectrum and the vivid signal based on the absolute spectrum are 1.0, the value of the vivid signal V$^B$[i,h] to be output is 1.0. When either one of the vivid signal based on the relative spectrum and the vivid signal based on the absolute spectrum are 0.0, the value of the vivid signal V$^B$[i,h] to be output is 0.0. In this way, the vivid signal to be output is determined based on the stricter evaluation among the absolute spectrum and relative spectrum.

This causes a band in which the vivid signal is 0.0 and a band in which the vivid signal is 1.0 to appear alternately within a certain interval on the Bark axis, and thereby, it is possible to suppress long continuous priority mixing being performed on the Bark axis. In other words, it possible to suppress attenuation of the non-priority sound over a long interval on the Bark axis, and to prevent degradation of the non-priority sound while emphasizing the priority sound.

Note that the upper threshold value and the lower threshold value of the absolute spectrum, and the upper threshold value and the lower threshold value of the relative spectrum may be set by input from the user. For example, the threshold value to be set may be changed depending on the frequency band.

Modified Example of the Third Embodiment

In FIG. 8, in the control signal generation unit 250, the vivid signal represented on the Bark axis is inversely transformed onto the linear frequency axis, and then, input into the gain derivation unit 19, to perform derivation of the gains on the linear frequency axis. This is because the linear axis is more convenient in the case of, for example, evaluating the signal energy in the gain derivation unit 19.

However, in the case where such evaluation is not necessary, the derivation of the gains may be performed on the Bark axis. In this case, the gain mask ($\alpha_1$ and $\alpha_2$ at each point on the time-frequency plane) represented on the Bark axis may be inversely transformed back onto the linear frequency axis, to perform multiplication by the gains.

In the case of performing transformation of the frequency axis, it may be transformed onto the ERB axis instead of the Bark, to generate the vivid signal.

If it is allowable to make the time constant of smoothing in the time direction by the control signal generation unit 250 for generating the vivid signal, equivalent to the time constant for smoothing the priority sound when deriving the gains, then, $E_V^B[i,h]=E_{V'}^B[i,h]$; therefore, the smoothing blocks in the time axis direction with respect to the priority sound can be shared. Further, if the weight coefficients of smoothing in the frequency-direction can also be the same, then, $F_V^B[i,h]=F_{V'}^B[i,h]$; therefore, the smoothing blocks in the frequency-direction (first smoothing) can be shared.

If displaying of the power on a graphical display device does not need to be performed on the Bark axis, transformation of the frequency axis does not need to be performed with respect to the power of the priority sound and the non-priority sound, and the corresponding inverse transformation can also be omitted. In this case, the frequency axis transformation unit 18 and the frequency axis inverse-transformation unit 21 can be omitted. As $D_1^B[i,h]$ and $D_2^B[i,h]$ are not determined, the logarithmic intensities log $|X_1[i,k]|$ and log $|X_2[i,k]|$ of the priority sound and the non-priority sound may be smoothed in the time direction as they are.

Further, instead of performing two stages of frequency smoothing (processing by the frequency-direction smoothing units 252 and 253) in the control signal generation unit 250, it is possible to use a bandpass filter. The bandpass filter repeats inversions of the output between the positive and the negative at the center frequency of passing frequencies, and hence, can satisfy the condition that a band in which the vivid signal is 1.0 and a band in which the signal is 0.0 appear alternately within a certain interval.

Other Modified Examples

The vivid signal is a signal that is 1.0 in the important frequency part of the priority sound such as a voice. Meanwhile, another sound that is mixed into the microphone (sound generally referred to as an "overlap") has a spectrum that is almost irrelevant to the vivid signal as long as the signal level is within a certain range.

By multiplying a microphone signal including an "overlap" by the vivid signal, it is possible to reduce the overlap in the microphone signal. This is because the multiplication by the vivid signal leaves only part of the vivid signal that is 1.0, namely, the important part of a voice, and such an effect is not generated for the overlapping component; therefore, overall, the voice is emphasized.

In the control signal generation units 150 and 250, the relative spectrum Hv[i,k] does not necessarily need to be represented by the difference between the first smoothing intensity and the second smoothing intensity in the frequency direction, and may be represented by a ratio of the two smoothing intensities.

Figure 10:
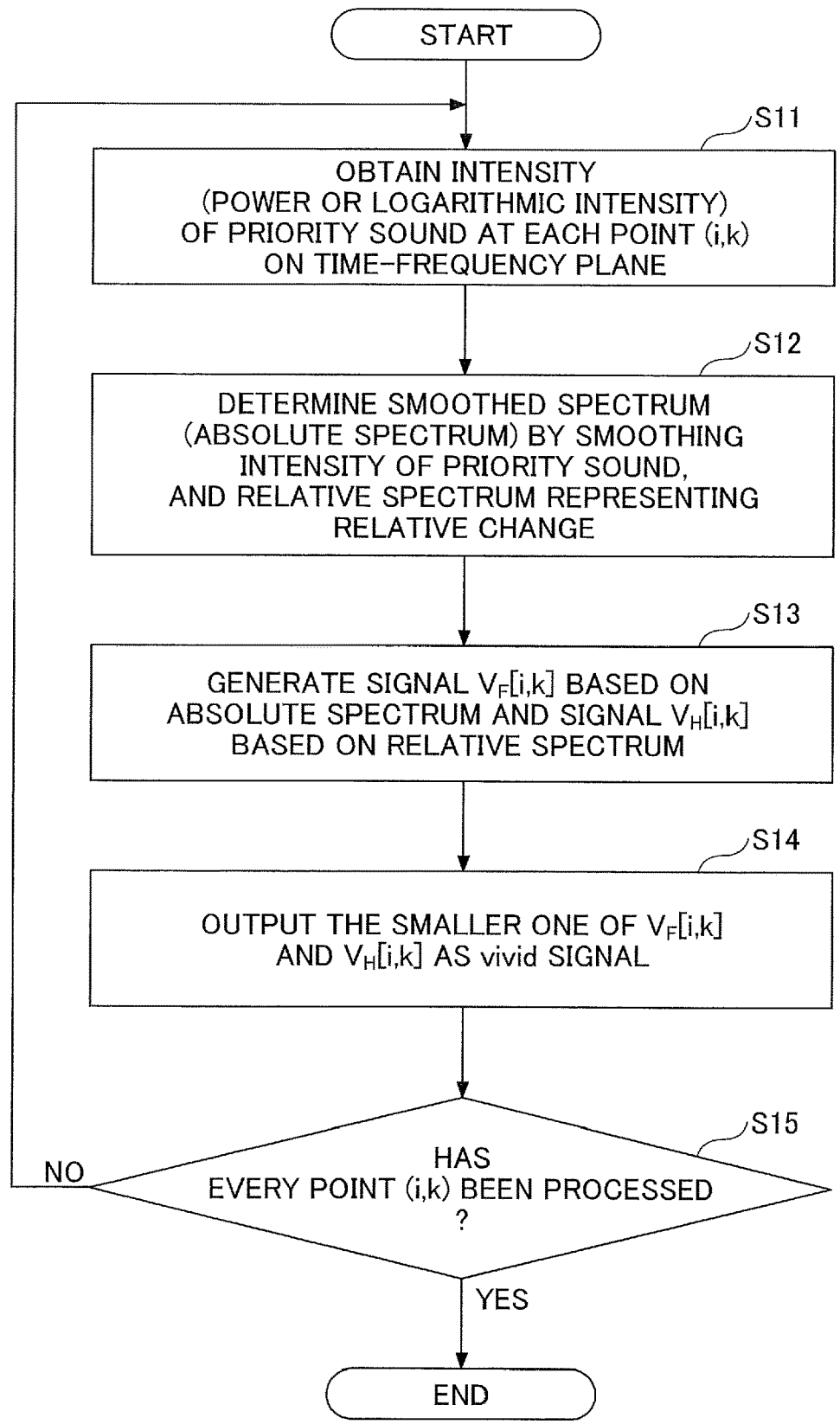
FIG. 10 is a flow chart illustrating a control signal generation process executed by a control signal generation unit of an embodiment.

FIG. 10 is a flow chart illustrating a flow of generating the control signal according to an embodiment. First, the intensity (power, logarithmic intensity, or the like) of the priority sound is obtained at each point (i,k) on the time-frequency plane (S11). A smoothed spectrum in which the intensity of the priority sound is smoothed in the time direction and in the frequency direction (absolute spectrum), and a relative spectrum that represents local irregularities (changes) in the absolute spectrum are obtained (S12).

A signal $V_F[i,k]$ based on the absolute spectrum and a signal $V_H[i,k]$ based on the relative spectrum are generated (S13), and the smaller one of $V_F[i,k]$ and $V_H[i,k]$ is output as a vivid signal (S14). The processing at Steps S11 to S14 is repeated until the processing is completed for all points (i,k) (YES at S15). This process can suppress continuation of a frequency interval where the vivid signal V[i,k] is 1.0 and the prioritized mixing is performed (including a suppression process for the non-priority sound), and prevent suppression of the non-priority sound over a wide range.

When the vivid signal is 1.0, the priority sound is multiplied by the gain $\alpha_1$ that increases the priority sound, and the non-priority sound is multiplied by the gain $\alpha_2$ that decreases the non-priority sound within a range in which the priority sound increase, and then, the multiplication results are added. When the vivid signal is 0.0, the simple addition is performed. When the vivid signal takes a value between 0.0 and 1.0, the gains $\alpha_1$ and $\alpha_2$ may be multiplied by coefficients depending on the value of the vivid signal, to reduce the amplification rate of $\alpha_1$ and the attenuation rate of $\alpha_1$.

Fourth Embodiment

The first to third embodiments described above use the vivid signal as a control signal to apply the prioritized sound mixing to a specific frequency band of the priority sound, so as to generate a natural mixed sound. The fourth embodiment provides a configuration and a method that further improve the rise of the priority sound.

The vivid signal is a control signal that suppresses degradation of the non-priority sound by applying the prioritized mixing to a specific important frequency band in the priority sound, and performing the simple addition for the other bands. If there is a time delay for the vivid signal to rise to "1" or a predetermined level, the timing of the priority mixing may be delayed, and the rise of the priority sound may be insufficient.

Thereupon, by getting rid of the rise delay of the vivid signal so as to apply the prioritized mixing without timing delay, the rise of the priority sound is improved.

The inventors have unraveled the cause of a time delay that occurs when the vivid signal rises to "1" or a predetermined level. First, when generating the absolute spectrum Fv[i,k], depending on the size of the window function of the frequency analysis, a delay may be generated; and second, exponential smoothing may further extend the delay.

If the generation of the absolute spectrum Fv[i,k] is delayed, the relative spectrum Hv[i,k] generated based on the absolute spectrum Fv[i,k] is also delayed.

As long as raising the vivid signal to "1" or a predetermined level after the sound reaches a certain level, a delay to a certain extent may occur with any method to be adopted. Thereupon, in the fourth embodiment, when the priority sound is silent, the vivid signal is set to "1" in all bands, and when the priority sound reaches an analyzable level and an analyzable time elapses, the vivid signal is set to "0" only in necessary bands.

The vivid signal is set to "1" when the priority sound is silent; therefore, the absolute spectrum cannot be used as the reference. Depending on the circumstances, the absolute spectrum as the reference and the relative spectrum as the reference are set to be selectable. For example, when the priority sound is silent, the video signal is generated only with the relative spectrum as the reference, and the upper limit of the threshold value of the relative spectrum $H^B_H[h]$ is set to be negative. A specific configuration of these will be described.

Figure 11A:
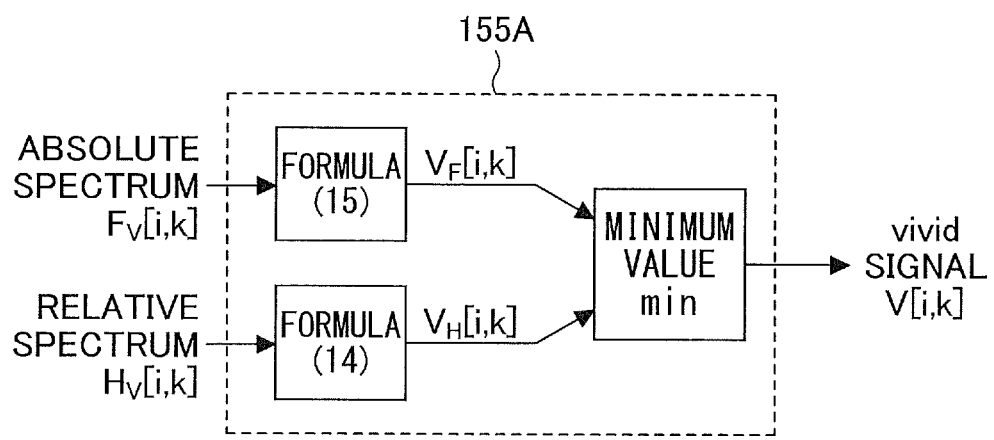
FIG. 11A is a diagram illustrating a configuration of a vivid signal generator in a normal mode.
Figure 11B:
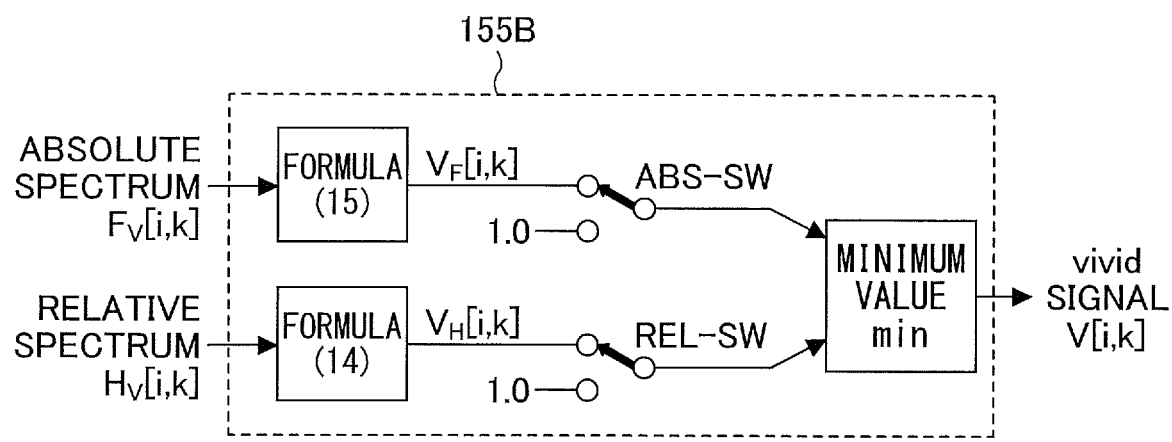
FIG. 11B is a diagram illustrating a configuration of a vivid signal generator of the third embodiment.

FIG. 11A illustrates operating blocks of the vivid signal generator 155A used in the first to third embodiments; and FIG. 11B illustrates operating blocks of the vivid signal generator 155B used in the fourth embodiment. The operation mode of the vivid signal generator 155A in FIG. 11A will be referred to as the "normal mode". The operation mode of the vivid signal generator 155B in FIG. 11B will be referred to as the "select mode".

The vivid signal generator 155A in FIG. 11A applies the function of Formula (15) to the absolute spectrum Fv[i,k] to generate the signal $V_F[i,k]$, applies the function of Formula (14) to the relative spectrum Hv[i,k] to generate the signal $V_H[i,k]$, and outputs the smaller one of the two control signals as the final vivid signal V[i,k].

The vivid signal generator 155B in FIG. 11B includes a first switch (ABS-SW) for selecting whether to use the absolute spectrum as the reference, and a second switch (REL-SW) for selecting whether to use the relative spectrum as the reference.

In the case of not using the absolute spectrum as the reference, the first switch (ABS-SW) is set to select a fixed value "1.0". In the case of not using the relative spectrum as the reference, the second switch (REL-SW) is set to select a fixed value "1.0". Among the results of the selection in the first switch (ABS-SW) and in the second switch (REL-SW), the smaller one is output as the final vivid signal V[i,k].

This selection process may be executed by the control signal generation unit 150 (FIG. 4) or 250 (FIG. 8) upon determination based on the intensity of the input priority sound signal, or may be executed according to input from the user.

Figure 12:
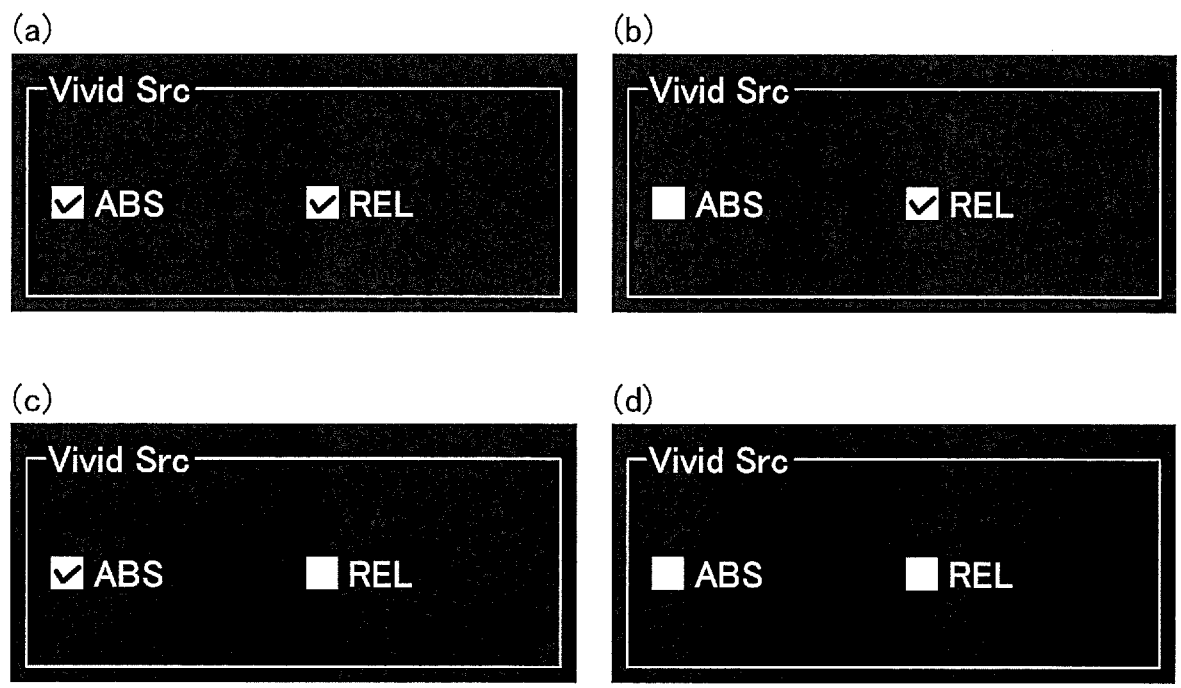
FIG. 12 is a diagram exemplifying GUI screens for selecting sources when generating a vivid signal.

FIG. 12 illustrates an example of an interface (GUI) that allows the mode selection according to input from the user. In a mode selection window (Vivid Src), a selection box for the absolute spectrum as the reference (ABS) and a selection box for the relative spectrum as the reference (REL) are displayed, which can be selected by, for example, entering a checking mark in the box.

Four combinations are possible as (a)-(d) in FIG. 12. When both of the absolute spectrum as the reference (ABS) and the relative spectrum as the reference (REL) are selected as (a) in FIG. 12, control signals are generated from the absolute spectrum and the relative spectrum, respectively, and as in the first to third embodiments, the smaller one is output.

As illustrated as (b) in FIG. 12, when only the spectrum as the reference (REL) is selected, the vivid signal is generated using only a control signal generated from the relative spectrum. This is because the value of the control signal of the absolute spectrum is fixed to "1.0", and the signal $V_H[i,k]$ generated from the relative spectrum is always smaller.

As illustrated as (c) in FIG. 12, when only the absolute spectrum as the reference (ABS) is selected, the vivid signal is generated using only a control signal generated from the spectrum. This is because the value of the control signal of the relative spectrum is fixed to "1.0", and the signal $V_F[i,k]$ generated from the absolute spectrum is always smaller.

As illustrated as (d) in FIG. 12, in the case where neither spectrum is selected as the reference, the smart mixer operates without using the vivid signal, and the gains are determined in all bands by the gain determination method of the smart mixer (method based on the "principle of the sum of logarithmic intensities" and "principle of fill-in").

From among the four combinations in FIG. 12, it is possible to select the most favorable setting depending on the nature of sound to be mixed, the situation on the site, and the like.

Figure 13A:
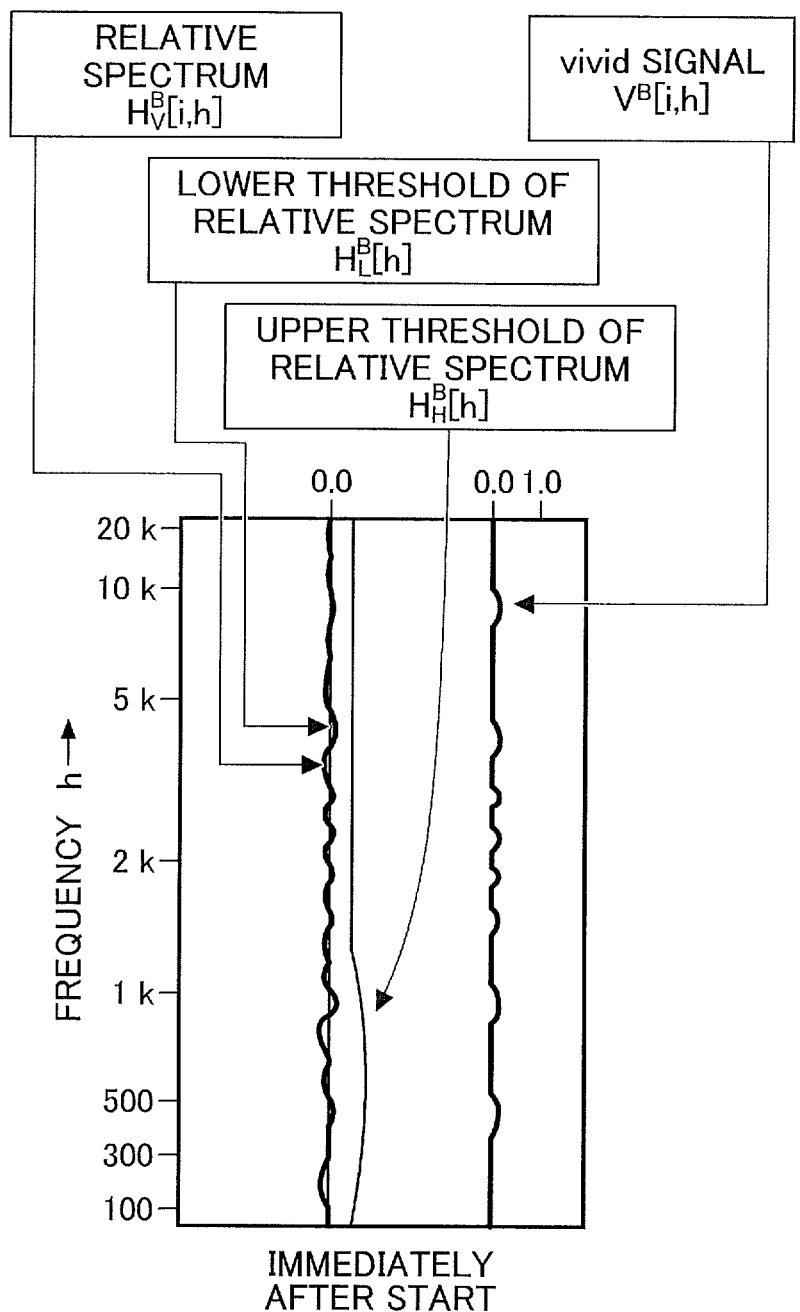
FIG. 13A is a waveform immediately after the rise of priority sound in a normal mode.

FIG. 13A illustrates an example of a waveform immediately after the priority sound has risen in the normal mode. In the normal mode, both the absolute spectrum as the reference and the relative spectrum as the reference are used; in the case where the relative spectrum has not risen sufficiently immediately after the priority sound has risen, the vivid signal takes a value of 0 or its vicinity over all the frequency bands. Therefore, virtually no operation of the smart mixing is performed, and the priority sound (e.g., a vocal) is not emphasized. In other words, the gain at the rising part of the priority sound is relatively insufficient, and the rise of the priority sound may not be heard sufficiently in the sound being mixed.

Figure 13B:
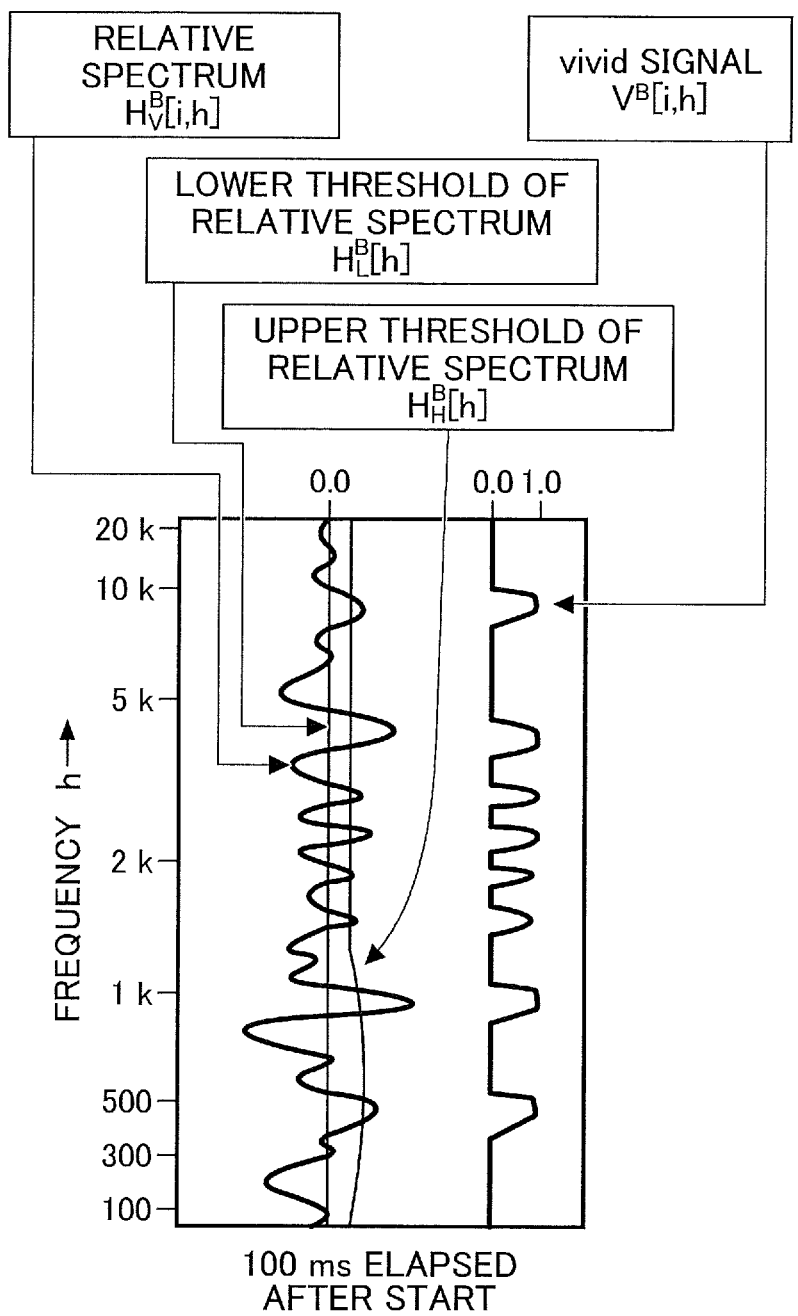
FIG. 13B is a waveform when 100 ms has elapsed after the rise of priority sound in the normal mode.

FIG. 13B is a waveform after 100 ms has elapsed since the rise of the priority sound in the normal mode. As the relative spectrum has grown sufficiently, the band in which the value of the vivid signal is "1" increases to nearly half, and the priority sound is emphasized by the smart mixing as expected.

Figure 13C:
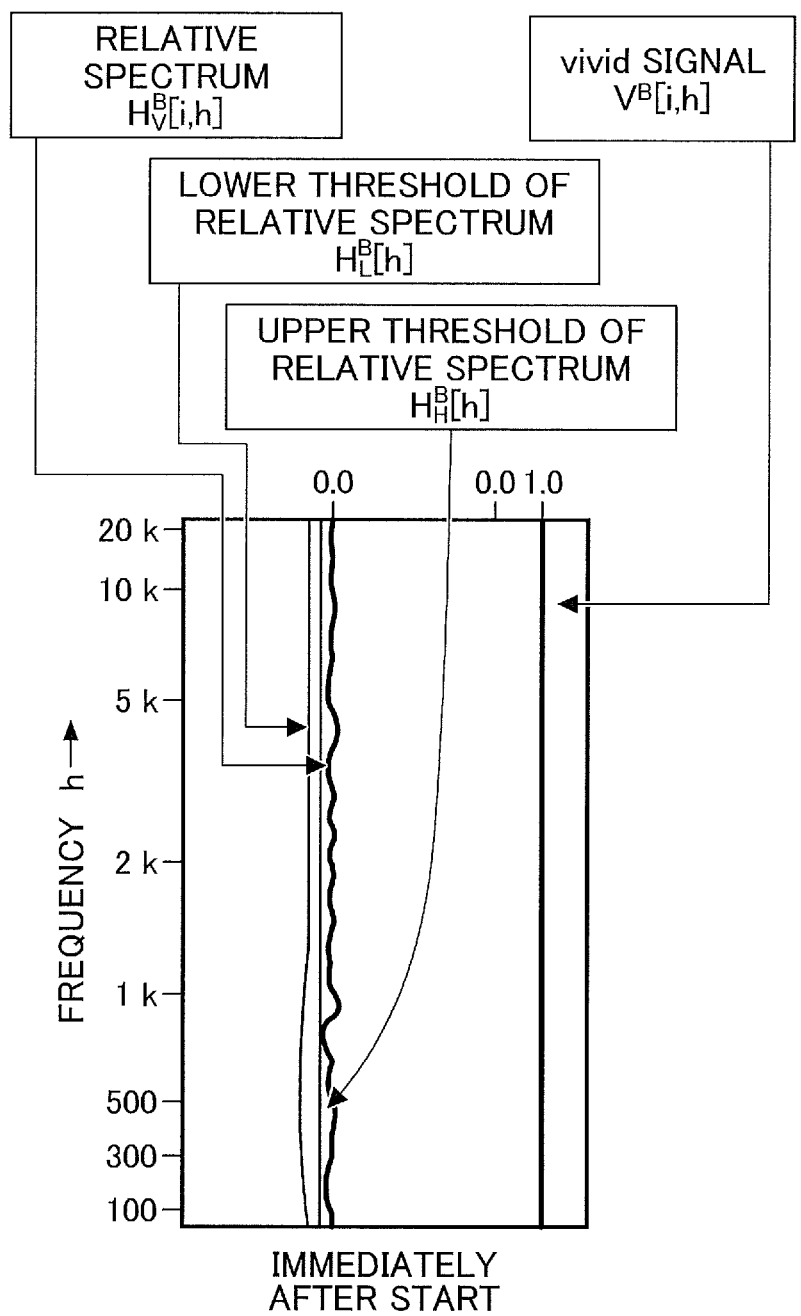
FIG. 13C is a waveform immediately after the rise when only a relative spectrum is selected in a select mode.

FIG. 13C is a waveform immediately after the rise when only a relative spectrum is selected in the select mode. The setting of selecting only the relative spectrum is adopted in the case where emphasis on the rise of the priority sound is particularly desirable.

Here, by adopting a special setting of the upper limit of the relative spectrum $H^B_H[h]$ being negative, the relative spectrum when there is no sound or the priority sound has just risen exceeds the upper limit threshold value all the time (see Formula (14)), and the vivid signal is "1" in all bands.

This setting has little effect on the non-priority sound. This is because the energy of the priority sound is weak when there is no sound or the priority sound has just risen; therefore, the non-priority sound is not reduced significantly by the rule of determining the gain in the smart mixing. According to the "principle of fill-in", the non-priority is reduced only within a range in which the priority sound is emphasized. Also, this is also because the rising time of the priority sound is short, ranging from a few ms to several tens ms; therefore, considering the continuous listening effect, it is not so important to protect the non-priority sound.

Figure 13D:
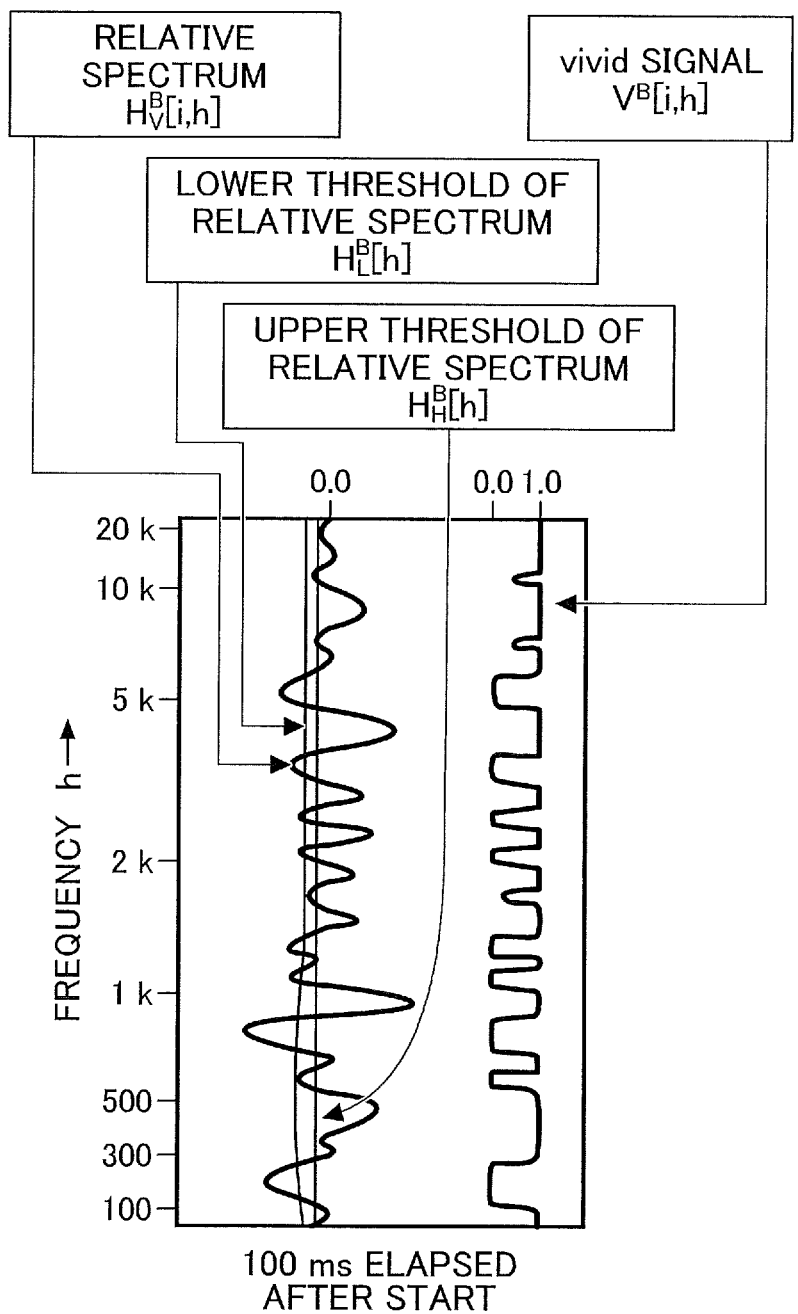
FIG. 13D is a waveform after 100 ms has elapsed since the rise when only a relative spectrum is selected in the select mode.

FIG. 13D illustrates the waveform 100 ms after the rise when only the relative spectrum is selected in the select mode. Although bands in which the vivid signal is "1" are expanded than in the normal mode in FIG. 13B, there are also a sufficient number of bands in which the "0" vivid signal, in which the "vivid" signal carries out its role of not degrading the non-priority sound while strengthening the rise of the priority sound.

By allowing to select whether to apply the absolute spectrum as the reference and the relative spectrum as the reference, respectively, it is possible to optimize the smart mixing for specific cases where there is no sound, the priority sound has just risen, and the like.

Figure 14:
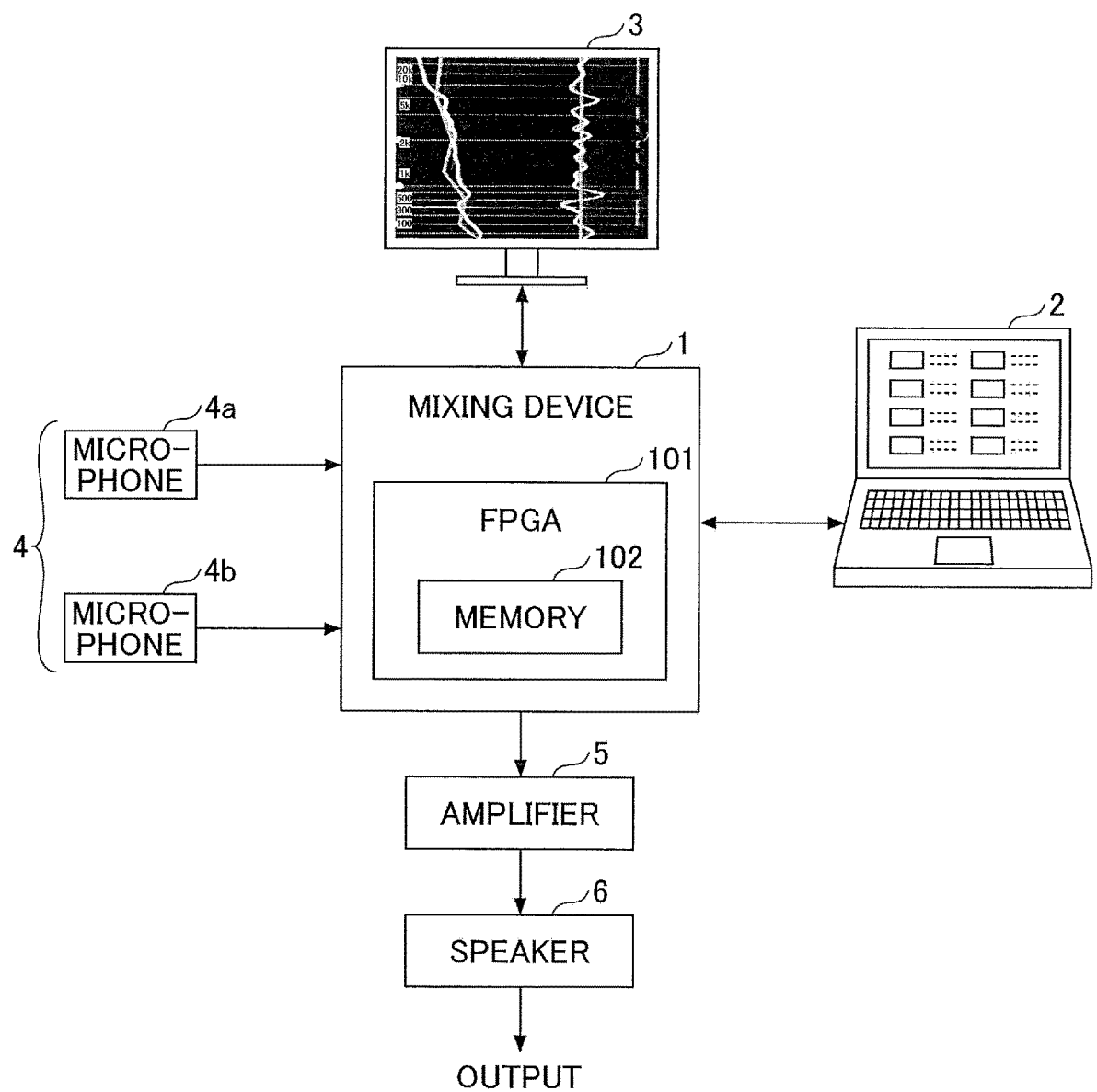
FIG. 14 is a schematic diagram of a mixing system using a mixing device of an embodiment.

FIG. 14 is a schematic diagram of a mixing system 100 using a mixing device 1 of an embodiment. The mixing device 1 can be implemented with a logic device 101 such as an FPGA or PLD (Programmable Logic Device). The mixing devices 1A to 10 in the configurations described above perform relatively simple calculation processes, and hence, function well with a memory 102 built in the logic device 101; however, the memory may be provided separately.

A user input/output device 2, a display device 3, audio signal input devices 4, and a speaker 6 are connected to the mixing device 1. An amplifier 5 may be inserted between the mixing device 1 and the speaker 6. The user input/output device 2 is an information processing terminal such as a personal computer (PC). On the user input/output device 2, a box is displayed for setting and entering parameters such as the upper limit threshold value $F_L[i,k]$ and the lower limit threshold value $F_L[i,k]$ of the absolute spectrum, and the upper limit threshold value $H_H[i,k]$ and the lower limit $H_L[i,k]$ of the relative spectrum, which allows input from the user.

The display device 3 is a monitor display of liquid crystal, organic electroluminescence, or the like. By displaying the absolute spectrum $Fv[i,k]$, the relative spectrum $Hv[i,k]$, the vivid signal, and the like on the display device 3, the user who performs mixing can recognize and adjust the spectrum of the input sound and the states of setting parameters.

The audio signal input devices 4 are, for example, microphones 4a and 4b, through which audio signals treated as the priority sound and audio signals treated as the non-priority sound are input into the mixing device 1. The signals mixed by the mixing device 1 is amplified by the amplifier 5, and output from the speaker 6.

By using the mixing device 1 of the embodiment, the following effects can be brought.
(1) While maintaining the effect of increasing the clarity of the priority sound as much as possible, it is possible to prevent occurrence of feeling of missing non-priority sound (degradation of the sound quality).
(2) The calculation load is light when implemented as software because it can be implemented with a combination of simple calculations. Also, suitable for implementation on a programmable logic device such as an FPGA. In the case of implementing as software, a program for executing the functions (smoothing, gain derivation, multiplication, and addition) of the components of the mixing device 1 of the embodiment including the flow of control signal generation illustrated in FIG. 10 may be installed in an information processing device such as a user terminal.
(3) A wide variety of sound sources can be treated as the priority sound, which include speeches, vocals, voices such as singing, and musical instrument sounds.
(4) It can be applied not only to mixing devices for business use at concert venues and recording studios, but also to mixers for amateurs, DAWs (Digital Audio Workstation), applications for smartphones, meeting systems, and the like.
(5) Other than the mixing, the vivid signal also has a function of simple overlap elimination with respect to one input audio signal.
(6) The rise of the priority sound becomes good.

The present invention has been described based on examples of specific configurations; note that the present invention includes various modifications, substitutions, and the like. For example, in FIGS. 3, 5 and 8, the order may be reversed between the addition of signals adjusted by the gains based on the control signals, and the transformation to the time domain signal by the frequency-time transformation unit 16. In other words, the priority sound and the non-priority sound, which have been adjusted by the gains with or without the prioritized mixing, may be individually transformed to time domain signals and then added.

As the output of signal processing units 15A-15C, the mixed signal after the addition does not need to be output necessarily; time domain signals of the priority sound and the non-priority sound adjusted by the gains with or without the prioritized mixing may be output separately.

As the output of the signal processing units 15A-15C, in addition to the priority sound and the non-priority sound adjusted by the gains with or without the prioritized mixing, the signal processing units 15A-15C may output the original sound of the priority sound, the original sound of the non-priority sound, the difference between the original sound of the priority sound and the signal after the gain adjustment, the original sound of the non-priority sound and the difference between the signal after the gain adjustment, and the like. In this case, individual outputs from the signal processing unit 15 may be input into an external mixer (e.g., a conventional mixer) to further perform mixing operations.

Similarly, in the system in FIG. 14, the output of the mixing device 1 is not limited to a mixed sound of the priority sound and the non-priority sound adjusted by the gains with or without the prioritized mixing. Before inputting the priority sound signal and the non-priority signal adjusted by the gains in the time domain into the amplifier 5, the signals may be further processed by another external mixer or the like to be input into the amplifier 5.

The present application claims priority under Japanese Patent Application No. 2018-078981, filed on Apr. 17, 2018, the entire contents of which are incorporated in the present application by reference.

DESCRIPTION OF REFERENCE SYMBOLS

1, 1A-1C mixing device
11 signal input unit
12 frequency analysis unit
15, 15A-15C signal processing unit
16 frequency-time transformation unit
17 signal output unit
18 frequency axis transformation unit
19 gain derivation unit
21 frequency axis inverse-transformation unit
150, 250 control signal generation unit
151, 251 time-direction smoothing unit
152, 252 frequency-direction smoothing unit
153, 253 frequency-direction smoothing unit
154, 254 subtraction unit (or ratio calculation unit)

The invention claimed is:

1. A mixing device of a first signal and a second signal on a time-frequency plane, comprising:
   a processor that generates a control signal indicating whether to perform prioritized mixing that includes amplification of the first signal and attenuation of the second signal, and derives a first gain for amplifying the first signal and a second gain for attenuating the second signal based on the control signal,
   wherein the control signal takes at least a first value and a second value different from the first value, wherein the first value is not continuous beyond a predetermined bandwidth on a frequency axis,
   wherein the mixing device applies the prioritized mixing to the first signal and the second signal in response to the control signal indicating the first value, and applies simple addition to the first signal and the second signal in response to the control signal indicating the second value, and wherein the processor performs
   first frequency processing with respect to an intensity of the first signal on the time-frequency plane, to obtain a first spectrum representing an absolute amount of the first signal, second frequency processing with respect to the first spectrum, to obtain a second spectrum indicating local changes of the first spectrum, and signal generation to generate the control signal based on the first spectrum and the second spectrum.

2. The mixing device as claimed in claim 1, wherein the processor performs threshold value processing with respect to the first spectrum and the second spectrum, and outputs a smaller one of a first threshold value processing result with respect to the first spectrum and a second threshold value processing result with respect to the second spectrum.

3. The mixing device as claimed in claim 2, wherein the processor generates a first control signal that takes the first value in response to the first spectrum being greater than or equal to the first threshold value and takes the second value in response to the second spectrum being less than the second threshold value, and a second control signal that takes the first value in response to the second spectrum being greater than or equal to a third threshold value and takes the second value in response to the second spectrum being less than a fourth threshold value, and outputs a smaller one of the first control signal and the second control signal as the control signal.

4. The mixing device as claimed in claim 1, wherein the processor switches on and off application of the first spectrum and the second spectrum depending on states of the first signal and the second signal.

5. The mixing device as claimed in claim 4, wherein the processor uses only the second spectrum in response to the first signal being silent or weak.

6. The mixing device as claimed in claim 4, further comprising:
a user interface configured to allow a user to select whether to perform application of the first spectrum and application of the second spectrum,
wherein the processor performs or does not perform the application of the first spectrum and the second spectrum according to input through the user interface.

7. The mixing device as claimed in claim 1, further comprising:
a bandpass filter configured to repeatedly invert an intensity signal of the first signal on the time-frequency plane in a frequency direction, to transmit the intensity signal,
wherein the processor generates the control signal based on output of the bandpass filter.

8. The mixing device as claimed in claim 1,
wherein the processor transforms a linear frequency axis to an axis based on a sense of hearing, to generate the control signal on the axis based on the sense of hearing.

9. The mixing device as claimed in claim 1, wherein the control signal takes a third value between the first value and the second value, and
wherein a degree of the prioritized mixing is adjusted depending on the third value.

10. A mixing method of a first signal and a second signal on a time-frequency plane, the mixing method comprising:
generating a control signal indicating whether to perform prioritized mixing that includes amplification of the first signal and attenuation of the second signal, the control signal taking at least a first value and a second value different from the first value, wherein the first value is not continuous beyond a predetermined bandwidth on a frequency axis;
deriving a first gain for amplifying the first signal and a second gain for attenuating the second signal based on the control signal; and
applying the prioritized mixing to the first signal and the second signal in response to the control signal indicating the first value, and applying simple addition to the first signal and the second signal in response to the control signal indicating the second value,
wherein the generating a control signal includes:
performing first frequency processing with respect to an intensity of the first signal on the time-frequency plane, to obtain a first spectrum representing an absolute amount of the first signal,
performing second frequency processing with respect to the first spectrum, to obtain a second spectrum indicating local changes of the first spectrum, and
generating the control signal based on the first spectrum and the second spectrum.

11. A non-transitory computer-readable recording medium having computer-readable instructions stored thereon, which when executed, causes a computer to execute a mixing process of a first signal and a second signal on a time-frequency plane, the mixing process comprising:
generating a control signal indicating whether to perform prioritized mixing that includes amplification of the first signal and attenuation of the second signal, the control signal taking at least a first value and a second value different from the first value, wherein the first value is not continuous beyond a predetermined bandwidth on a frequency axis;
deriving a first gain for amplifying the first signal and a second gain for attenuating the second signal based on the control signal; and
applying the prioritized mixing to the first signal and the second signal in response to the control signal indicating the first value, and applying simple addition to the first signal and the second signal in response to the control signal indicating the second value,
wherein the generating a control signal includes:
performing first frequency processing with respect to an intensity of the first signal on the time-frequency plane, to obtain a first spectrum representing an absolute amount of the first signal,
performing second frequency processing with respect to the first spectrum, to obtain a second spectrum indicating local changes of the first spectrum, and
generating the control signal based on the first spectrum and the second spectrum.

\* \* \* \* \*